(12) United States Patent
Kaneko et al.

(10) Patent No.: US 9,196,609 B2
(45) Date of Patent: Nov. 24, 2015

(54) SEMICONDUCTOR DEVICE

(71) Applicant: KABUSHIKI KAISHA TOSHIBA, Minato-ku (JP)

(72) Inventors: Hajime Kaneko, Yokkaichi (JP); Keiichi Shimada, Yokkaichi (JP); Takamasa Usui, Yokkaichi (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/208,813

(22) Filed: Mar. 13, 2014

(65) Prior Publication Data

US 2015/0076708 A1    Mar. 19, 2015

(30) Foreign Application Priority Data

Sep. 18, 2013   (JP) .................................. 2013-192994

(51) Int. Cl.
*H01L 23/522*   (2006.01)
*H01L 27/02*    (2006.01)
(Continued)

(52) U.S. Cl.
CPC .......... *H01L 27/0207* (2013.01); *H01L 21/764* (2013.01); *H01L 27/11519* (2013.01); *H01L 27/11531* (2013.01); *H01L 27/11565* (2013.01); *H01L 27/11573* (2013.01); *H01L 23/5222* (2013.01); *H01L 23/5226* (2013.01); *H01L 2924/0002* (2013.01); *H01L 2924/01078* (2013.01); *H01L 2924/01079* (2013.01)

(58) Field of Classification Search
CPC ................. H01L 23/5226; H01L 2924/01078; H01L 2924/01079
USPC .......... 257/E21.578, E23.145, 750, 751, 758, 257/762, 763, 774–776; 438/629, 639, 640, 438/667, 668, 672, 675, 700, 701, 713, 978
IPC .................................................... H01L 23/5226
See application file for complete search history.

(56) References Cited

U.S. PATENT DOCUMENTS

| | | | |
|---|---|---|---|
| 6,828,617 B2 * | 12/2004 | Uh et al. ........................ | 257/306 |
| 6,982,200 B2 * | 1/2006 | Noguchi et al. .............. | 438/253 |
| 7,192,862 B2 * | 3/2007 | Mitani .......................... | 438/629 |

(Continued)

FOREIGN PATENT DOCUMENTS

| | | |
|---|---|---|
| JP | 2000-036537 A | 2/2000 |
| JP | 2005-045006 A | 2/2005 |

(Continued)

*Primary Examiner* — Eugene Lee
(74) *Attorney, Agent, or Firm* — Oblon, McClelland, Maier & Neustadt, L.L.P.

(57) ABSTRACT

A semiconductor device includes a first contact plug, a diametric dimension of an upper end portion thereof greater than the lower end portion thereof; a first insulating film above a substrate and covering the first plug; a second contact plug, a diametric dimension of an upper end portion thereof less than lower end portion thereof, the lower end portion contacting the upper end portion of the first plug; a second insulating film above the first insulating film and the first plug and covering the second plug; a wiring layer including a lower end portion contacting the upper end portion of the second plug; and a third insulating film above the second insulating film and the second plug and covering the wiring layer; wherein the upper end portion of the first plug displaced from the lower end portion of the second plug has a step.

12 Claims, 41 Drawing Sheets

(51) Int. Cl.
*H01L 21/764* (2006.01)
*H01L 27/115* (2006.01)

(56) References Cited

U.S. PATENT DOCUMENTS

| | | | | |
|---|---|---|---|---|
| 7,521,357 B2 * | 4/2009 | Lee et al. | | 438/634 |
| 7,569,475 B2 * | 8/2009 | Yang et al. | | 438/618 |
| 7,635,644 B2 * | 12/2009 | Seok | | 438/626 |
| 7,692,304 B2 | 4/2010 | Fukumoto | | 257/758 |
| 7,745,331 B2 | 6/2010 | Hwang | | 433/672 |
| 7,745,864 B2 * | 6/2010 | Koo | | 257/296 |
| 7,803,683 B2 | 9/2010 | Nishimura | | 438/266 |
| 7,880,303 B2 * | 2/2011 | Yu et al. | | 257/751 |
| 7,960,838 B2 * | 6/2011 | Hsu et al. | | 257/774 |
| 7,977,724 B2 * | 7/2011 | Park | | 257/306 |
| 8,058,734 B2 | 11/2011 | Ono | | 257/775 |
| 8,193,088 B2 * | 6/2012 | Kim | | 438/637 |
| 2004/0119164 A1 * | 6/2004 | Kurashima et al. | | 257/758 |
| 2008/0142977 A1 * | 6/2008 | Watanabe et al. | | 257/758 |
| 2009/0096104 A1 * | 4/2009 | Lee et al. | | 257/758 |
| 2010/0084770 A1 | 4/2010 | Sakuma et al. | | 257/774 |
| 2010/0295134 A1 * | 11/2010 | Nagashima et al. | | 257/390 |
| 2010/0301489 A1 * | 12/2010 | Seidel et al. | | 257/773 |
| 2011/0147939 A1 * | 6/2011 | La Tulipe et al. | | 257/758 |
| 2011/0215473 A1 | 9/2011 | Noda et al. | | 257/750 |
| 2012/0241978 A1 | 9/2012 | Mino | | 257/775 |

FOREIGN PATENT DOCUMENTS

| | | |
|---|---|---|
| JP | 2008-010737 A | 1/2008 |
| JP | 2008-016837 A | 1/2008 |
| JP | 2008-021881 A | 1/2008 |
| JP | 2008-177446 A | 7/2008 |
| JP | 2009-152361 A | 7/2009 |
| JP | 2010-092987 A | 4/2010 |
| JP | 2010-109183 A | 5/2010 |
| JP | 2010-272638 A | 12/2010 |
| JP | 2011-187625 A | 9/2011 |
| JP | 2012-199381 A | 10/2012 |

* cited by examiner

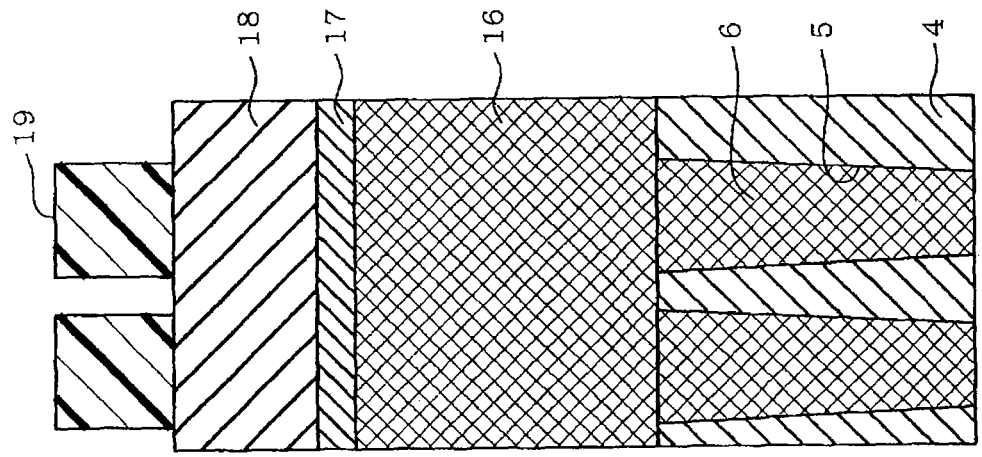
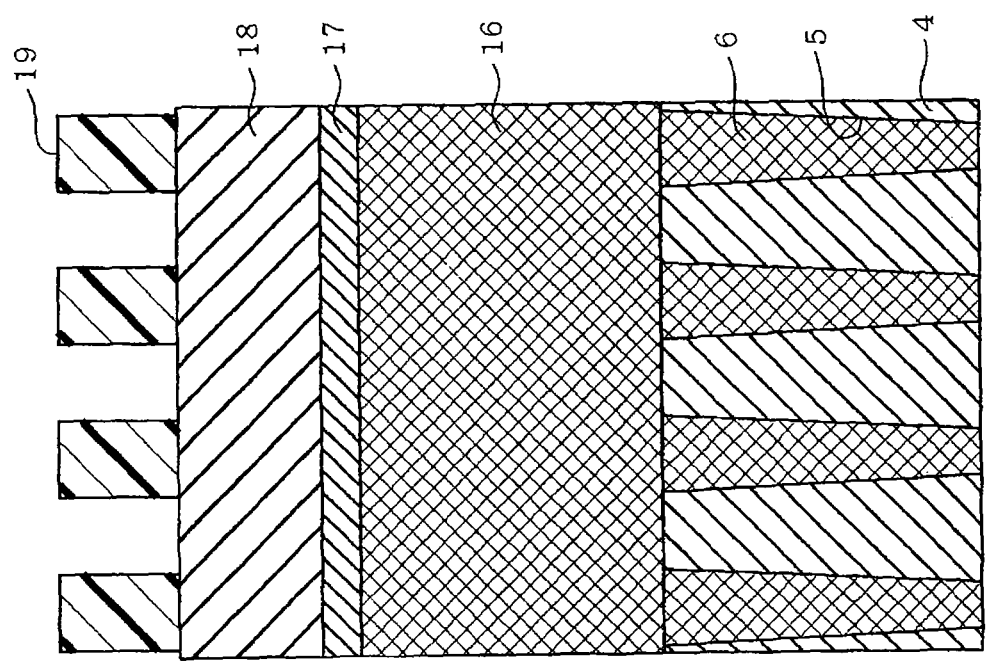

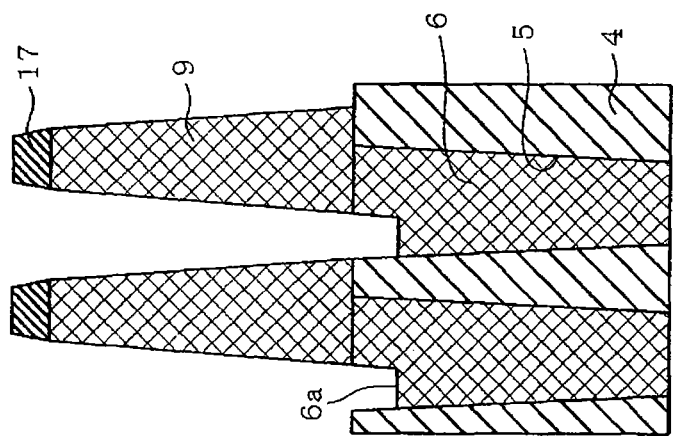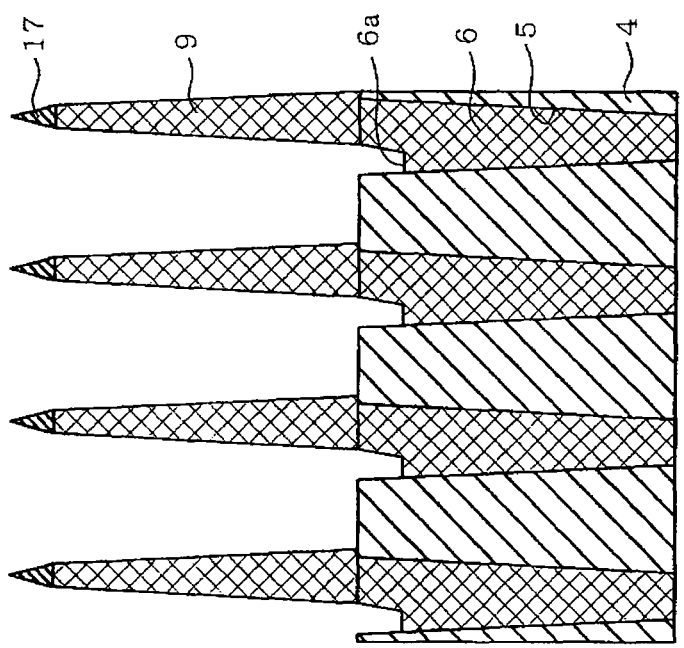
FIG. 8B
FIG. 8A

SEMICONDUCTOR DEVICE

CROSS-REFERENCE TO RELATED APPLICATION(S)

This application is based upon and claims the benefit of priority from Japanese Patent Application No. 2013-192994, filed on, Sep. 18, 2013 the entire contents of which are incorporated herein by reference.

FIELD

Embodiments disclosed herein generally relate to a semiconductor device.

BACKGROUND

In nonvolatile semiconductor storage devices, bit lines are disposed within a memory cell region with a predetermined spacing from one another. The bit lines are connected with contact plugs.

In the above described arrangement, lithography misalignment or the like occurring at the connection portions of contact plugs and bit lines may close the distance between the contact plug and the bit line disposed adjacent to the bit line to which the contact plug is supposed to contact. The distance between the contact plugs may also be closed by lithography misalignment or the like. Such closing of distance, or the like, between the contact plug and the adjacent bit line may lead to increase in leakage current.

BRIEF DESCRIPTION OF THE DRAWINGS

FIG. 6A corresponds to FIG. 1 and illustrates one phase of the manufacturing process flow.

FIG. 6B corresponds to FIG. 4 and illustrates one phase of the manufacturing process flow.

FIG. 8A corresponds to FIG. 1 and illustrates one phase of the manufacturing process flow.

FIG. 8B corresponds to FIG. 4 and illustrates one phase of the manufacturing process flow.

DESCRIPTION

In one embodiment, a semiconductor device includes a semiconductor substrate; a first contact plug having an upper end portion and a lower end portion, a diametric dimension of the upper end portion being greater than a diametric dimension of the lower end portion; a first insulating film disposed above the semiconductor substrate and covering the first contact plug; a second contact plug having an upper end portion and a lower end portion, a diametric dimension of the upper end portion of the second contact plug being less than a diametric dimension of the lower end portion of the second contact plug, the lower end portion of the second contact plug contacting the upper end portion of the first contact plug; a second insulating film disposed above the first insulating film and the first contact plug and the second insulating film covering the second contact plug; a wiring layer including a lower end portion contacting the upper end portion of the second contact plug; and a third insulating film disposed above the second insulating film and the second contact plug, the third insulating film covering the wiring layer; wherein the upper end portion of the first contact plug displaced from the lower end portion of the second contact plug has a step.

(Embodiments)

Embodiments are described hereinafter with reference to the accompanying drawings. Elements substantially identical across the embodiments are identified with identical reference symbols and are not re-described. The drawings are merely schematic and not drawn to scale and thus, do not reflect the actual measurements of the features such as the correlation of thickness to planar dimensions and the relative thickness of different layers.

(First Embodiment)

Figure 1:
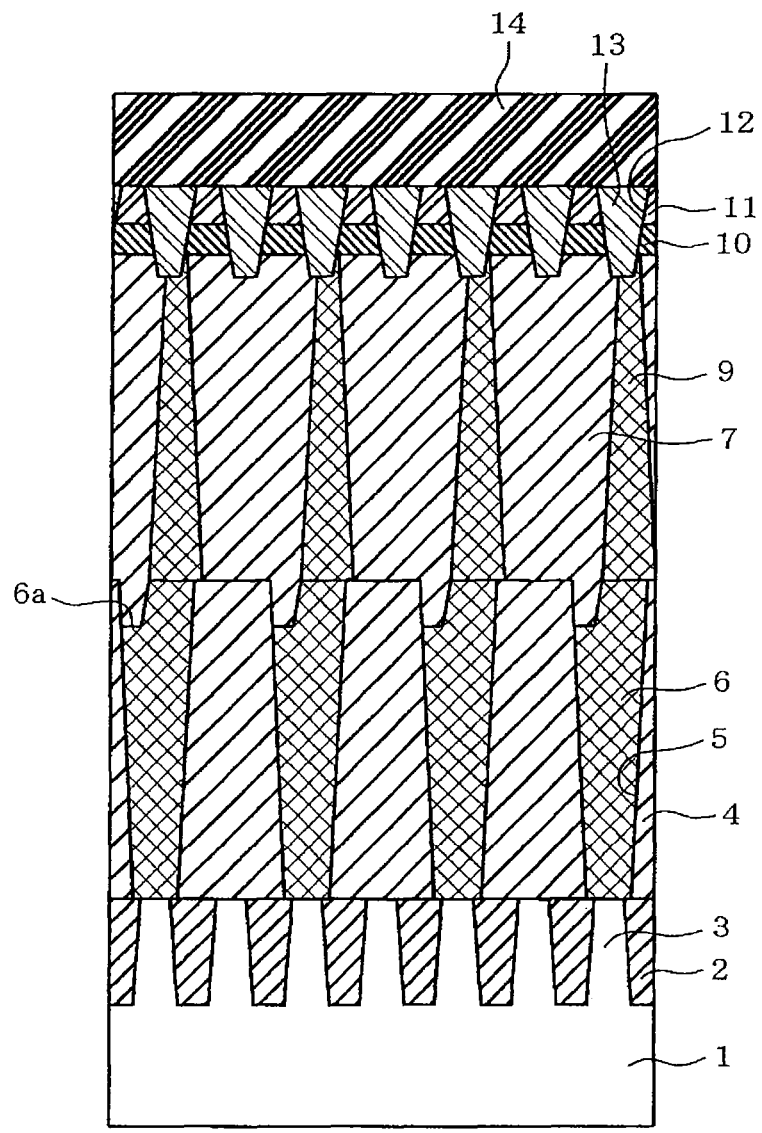
FIG. 1 is one example of a cross sectional view illustrating a structure of a semiconductor device of a first embodiment.

Referring to FIGS. 1 to 14, a description will be given on a first embodiment directed to, for example, a NAND flash memory device. FIG. 1 is one example of a cross-sectional view schematically illustrating the structure of a bit line contact portion of a NAND flash memory device.

Referring to FIG. 1, the surface layer portion of semiconductor substrate 1 (one example of which may be a silicon substrate), are divided into element regions 3 by element isolation regions 2. Element isolation region 2 is obtained by forming trenches (element isolation trenches) into the surface layer portion of semiconductor substrate 1 at a predetermined spacing and filling the trenches with an element isolation insulating film such as a silicon oxide film. In the surface layer of element region 3, a diffusion region (not shown) serving as a drain region is formed. Though not shown, gate electrodes of select transistors and memory cell transistors are stacked above the upper surface of semiconductor substrate 1 via a gate insulating film. FIG. 1 illustrates a portion where the stacked structures of the aforementioned gate electrodes were formed and removed by subsequent etching.

Above the upper surface of semiconductor substrate 1, silicon oxide film 4 serving as a first insulating film is formed in a predetermined thickness. Lower contact hole 5 is formed so as to extend from the upper surface to the lower surface of silicon oxide film 4. Lower contact hole 5 is formed so as to expose every other element region 3 of semiconductor substrate 1. In other words, lower contact holes 5 are formed in element region 3 in a so called double zigzag layout. Lower contact holes 5 may be formed in a so called triple zigzag layout. Lower contact hole 5 is formed in a forward taper so that the diametric dimension (transverse cross-sectional area) of the upper end opening is greater than the diametric dimension (transverse cross-sectional area) of the lower end opening.

The lower contact hole 5 is filled with conductive material such as tungsten (W) via barrier metal such as titanium/titanium nitride (Ti/TiN) to form lower contact plug 6 (bit line contact CB). Lower contact plug 6 is one example of a first contact plug. Lower contact plug 6 is formed in a forward taper so that the diametric dimension (transverse cross-sectional area) of the upper end portion is greater than the diametric dimension (transverse cross-sectional area) of the lower end portion.

Figure 2:
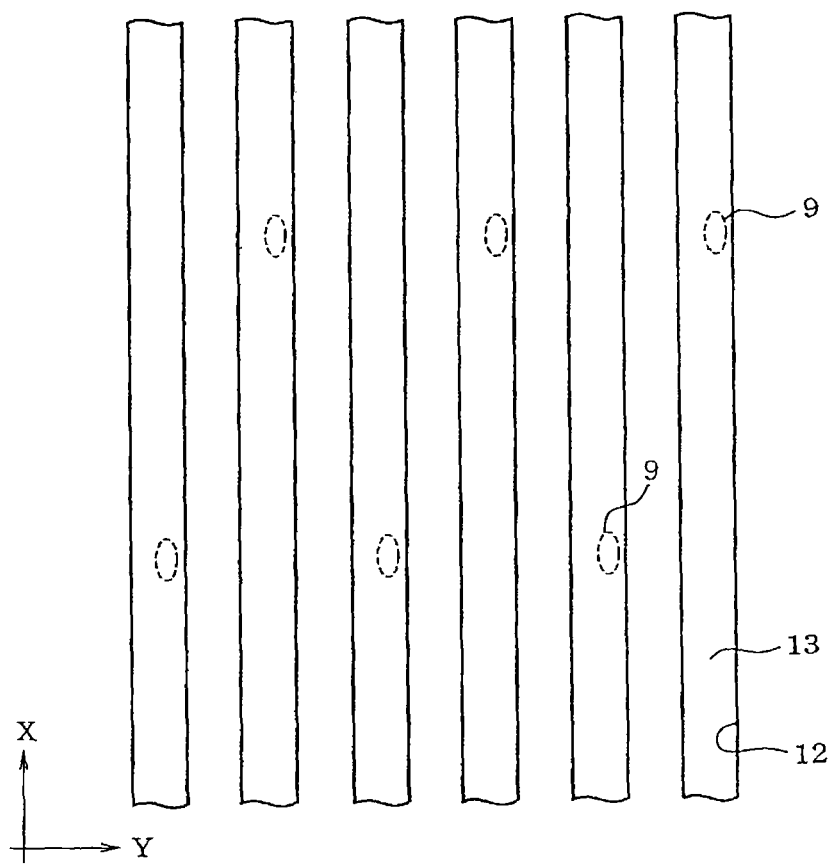
FIG. 2 is one example of a plan view illustrating a lower layer portion of the semiconductor device.
Figure 3:
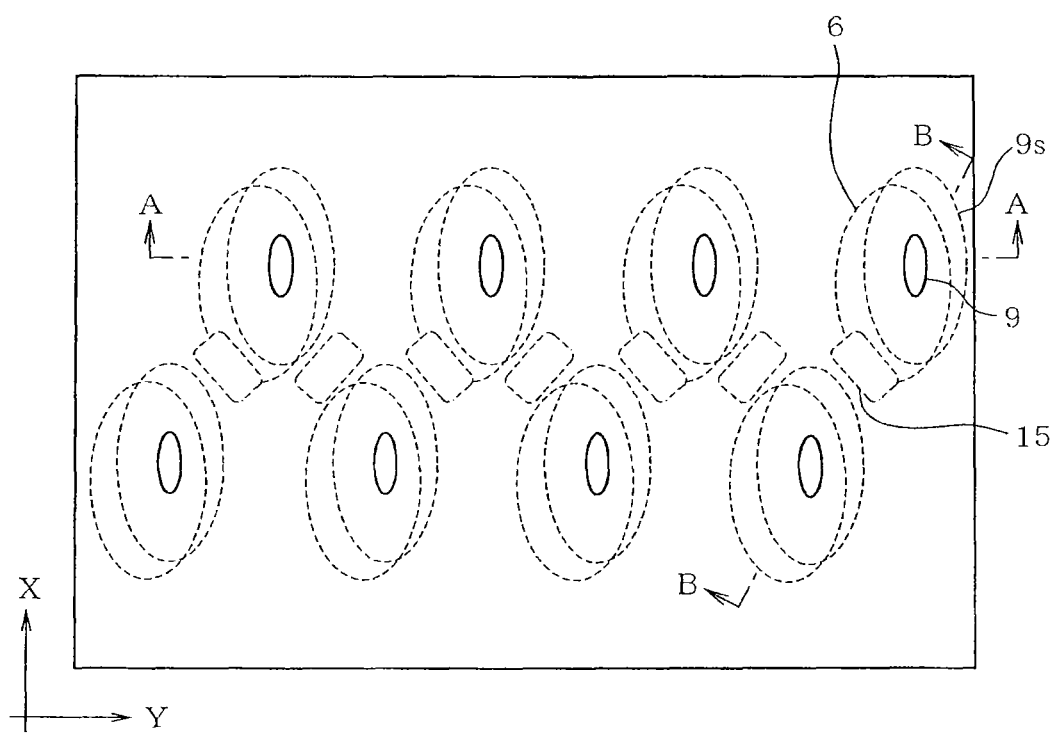
FIG. 3 is another example of a plan view illustrating a lower layer portion of the semiconductor device.

Above the upper surface of silicon oxide film 4, silicon oxide film 7 is formed in a predetermined thickness. Silicon oxide film 7 is one example of a second insulating film. Upper contact plug 9 (bit line via plug) is formed through silicon oxide film 7 so as to extend from the upper surface to the lower surface of silicon oxide film 7. Thus, upper contact plug 9 is located above lower contact plug 6. Upper contact plug 9 is formed in a reverse taper so that the diametric dimension (transverse cross-sectional area) of the upper end portion is less than the diametric dimension (transverse cross-sectional area) of the lower end portion as shown in FIGS. 1 and 3. Upper contact plug 9 is made of conductive material such as tungsten (W). The lower end portion of upper contact plug 9 is coupled to or contacts the upper end portion of lower contact plug 6. One contact plug 9 is provided for every one contact plug 6. As shown in FIG. 2, contact plugs 9 are disposed in a double zigzag layout as was the case for contact plug 6. Misalignment may occur between contact plug 6 and contact plug 9. In such case, the locations of contact plug 6 and contact plug 9 are displaced from each other in top view. Step 6a is formed in a portion of the upper portion of lower contact plug 6 which is displaced from upper contact plug 9.

Above the upper surface of silicon oxide film 7, SiN film 10 and silicon oxide film 11 are formed which, taken together, are one example of a third insulating film. Trench 12 is formed through SiN film 10 and silicon oxide film 11 so as to extend from the upper surface to the lower surface of SiN film 10 and silicon oxide film 11, respectively. Trench 12 is used for forming bit line BL. As shown in FIG. 2, trench 12 extends in the X direction (bit line direction: the direction in which element isolation region 2 and element region 3 extend) and are disposed with a constant spacing between one another in the Y direction. Trench 12 is filled with conductive material such as copper (Cu) to form wiring layer 13 (bit line BL). The upper end of upper contact plug 9 is coupled to the lower end portion of wiring layer 13. Interlayer insulating film 14 (SiN film) is formed above silicon oxide film 11 and wiring layer 13. In one embodiment, upper contact plugs 9 are disposed with equal spacing between one another and wiring layers 13 are disposed with equal spacing between one another. FIG. 2 is one example of a plan view schematically illustrating the layout pattern of wiring layers 13.

Figure 4:
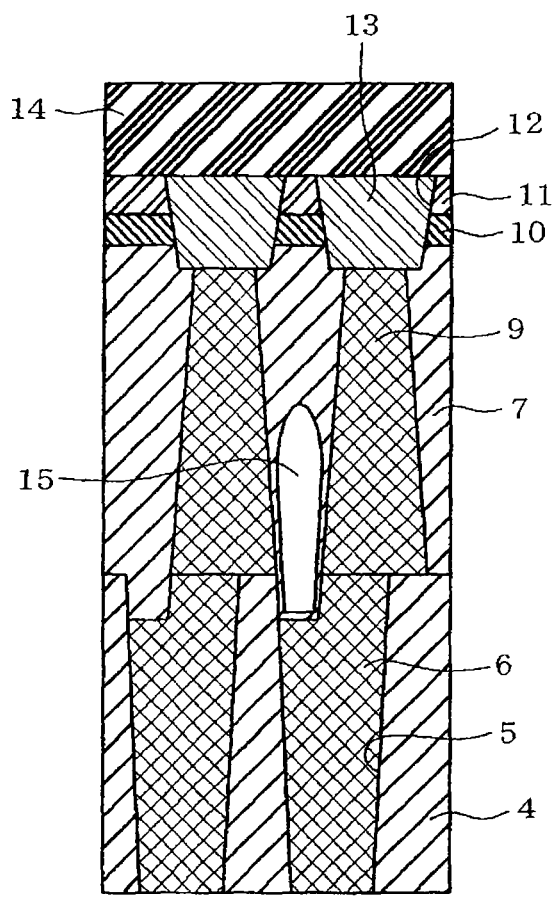
FIG. 4 is one example of a cross sectional view taken along line 3-3 of FIG. 3.

Next, the first embodiment will be described in detail. FIG. 3 is one example of a schematic plan view for describing the relation between upper contact plug 9 and lower contact plug 6 and shows the layout pattern of upper contact plug 9 and lower contact plug 6 in top view. FIG. 1 is a cross-sectional view taken along line A-A of FIG. 3. FIG. 4 is a cross-sectional view taken along line B-B of FIG. 3. Further, wiring layer 13 is not shown in FIG. 3 for ease of explanation.

In the first embodiment, the diametric dimension of lower portion 9s of upper contact plug 9 is increased as shown in FIGS. 3 and 4. Thus, the distance between upper contact plug 9 and lower contact plug 6 adjacent in the oblique XY axis direction or the distance between upper contact plugs 9 adjacent in the oblique XY axis direction is reduced or closed. In the portion where the distance between lower contact plug 6 and the adjacent upper contact plug 9 are closed, air gap 15 is formed. The state of being "adjacent in the oblique XY axis direction" may also be referred to as being "XY directionally adjacent".

The upper end portion of air gap 15 is lower in elevation compared to the upper surface of upper contact plug 9. Further, the lower portion of air gap 15 is lower in elevation compared to the upper surface of lower contact plug 6.

Figure 5:
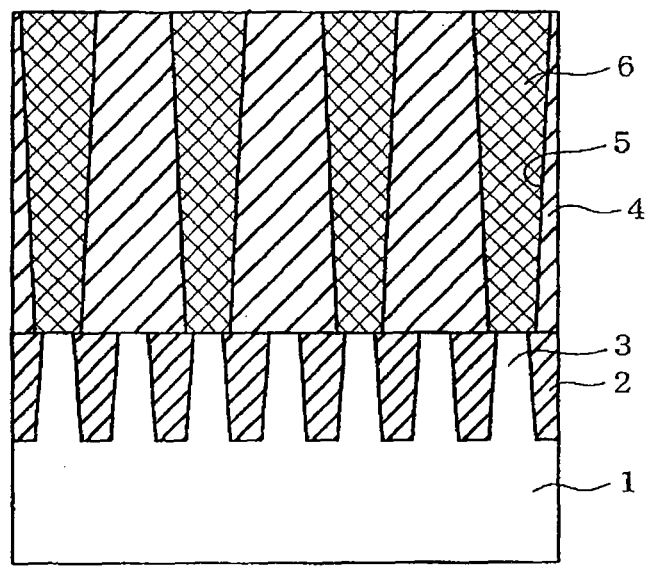
FIG. 5 corresponds to FIG. 1 and illustrates one phase of the manufacturing process flow.

Next, the manufacturing process flow of the above described structure will be described with reference to FIGS. 5 to 14. As shown in FIG. 5, element region 3 is isolated by forming element isolation region 2 into semiconductor substrate 1. Then, silicon oxide film 4 is deposited by CVD. Silicon oxide film 4 is anisotropically etched by RIE (Reactive Ion Etching) or the like to form lower contact hole 5.

Thereafter, lower contact plug 6 is filled into lower contact hole 5. More specifically, barrier metal formed, for example, of conductive material such as titanium/titanium nitride is formed along the inner surface of lower contact hole 5, and tungsten (W) or the like is filled along the inner side of the barrier metal. Then, tungsten deposited above the upper surface of silicon oxide film 4 is planarized by CMP (Chemical Vapor Deposition) to expose the upper surface of silicon oxide film 4. The structure illustrated in FIG. 5 is formed in the above described manner.

Figure 7A:
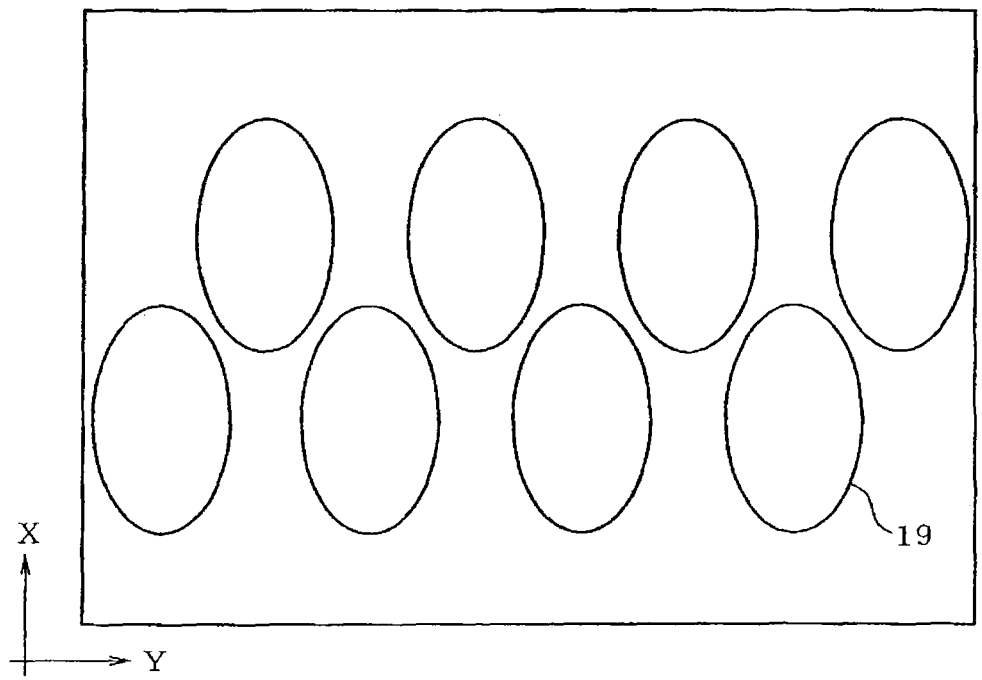
FIGS. 7A and 7B are examples of plan views of the semiconductor device illustrating one phase of the manufacturing process flow.
Figure 7B:
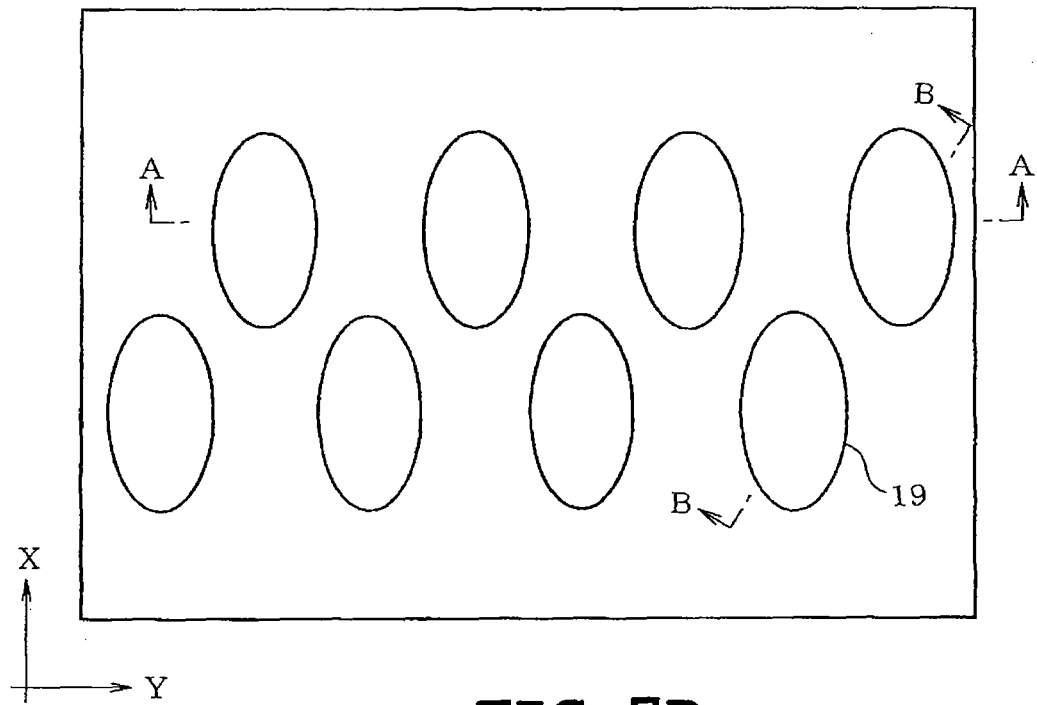

Then, as shown in FIGS. 6A and 6B, tungsten film 16 is formed in a predetermined thickness above the upper surface of silicon oxide film 4 and lower contact plug 6. Then, SiN film 17 and amorphous Si film 18 are formed as hard masks above tungsten film 16. Then, resist mask pattern 19 is formed by coating a photoresist and patterning the photoresist by exposure development. Resist mask pattern 19 is formed larger than the intended size by photolithography as shown in FIG. 7A and thereafter reduced in size by sliming or the like as shown in FIG. 7B. FIG. 6A is a cross-sectional view taken along line A-A of FIG. 7B and FIG. 6B is a cross-sectional view taken along line B-B of FIG. 7B.

Figure 9:
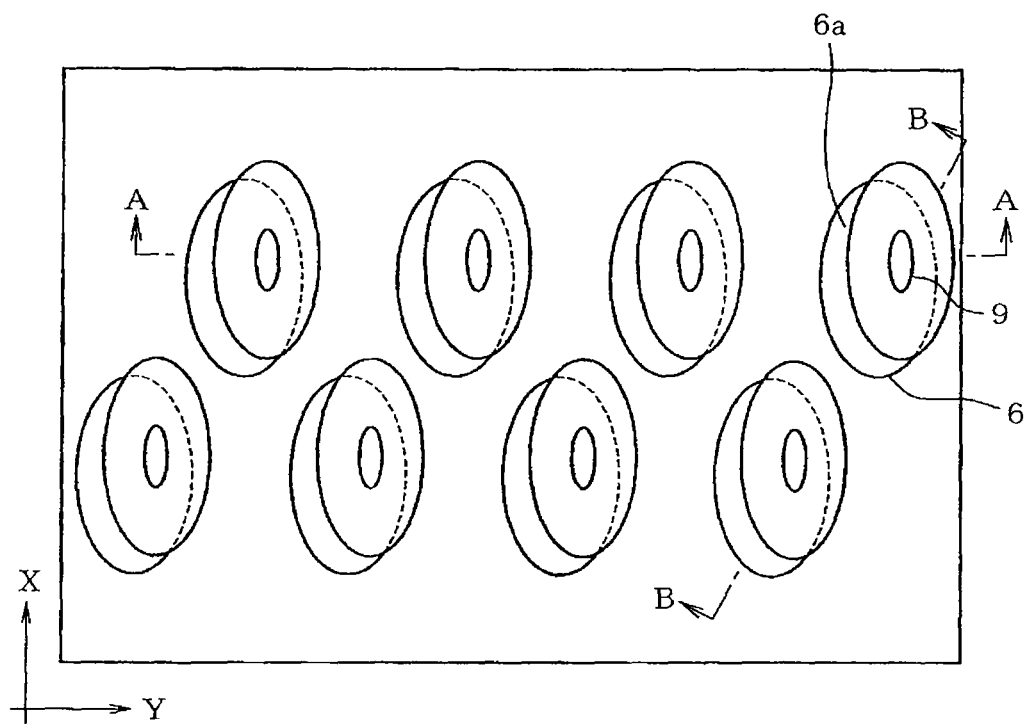
FIG. 9 is one example of a plan view of the semiconductor device in one phase of the manufacturing process flow.

Then, as shown in FIGS. 8A and 8B, upper contact plug 9 is formed by processing tungsten film 16 by RIE using resist mask pattern 19 and the hard mask as masks. Upper contact plug 9 is processed to have a tapered shape and a thin upper portion. As a result, sufficiently large distance can be secured between XY adjacent upper contact plugs 9 and between the upper portion of upper contact plug 9 and wiring layer 13 adjacent in the Y direction (See FIG.1). Further, a portion of the upper portion of lower contact plug 6 displaced from the lower portion of upper contact plug 9 is etched down by RIE. Thus, step 6a is formed in the upper portion of lower contact plug 6. Step 6a may be formed by over-etching. Even if the distance between the upper portion of lower contact plug 6 and the lower portion of the XY adjacent upper contact plug 9 is closed in top view by misalignment, the distance between the upper portion of lower contact plug 6 and the lower portion of the XY adjacent upper contact plug 9 taken along a direction perpendicular to the main plane of the semiconductor is increased. As a result, large distance can be secured between the upper portion of lower contact plug 6 and the lower portion of the XY adjacent upper contact plug 9 (FIG.8B and FIG.9). FIG.8A is a cross-sectional view taken along line A-A of FIG.9 and FIG.8B is a cross-sectional view taken along line B-B of FIG.9.

Figure 10A:
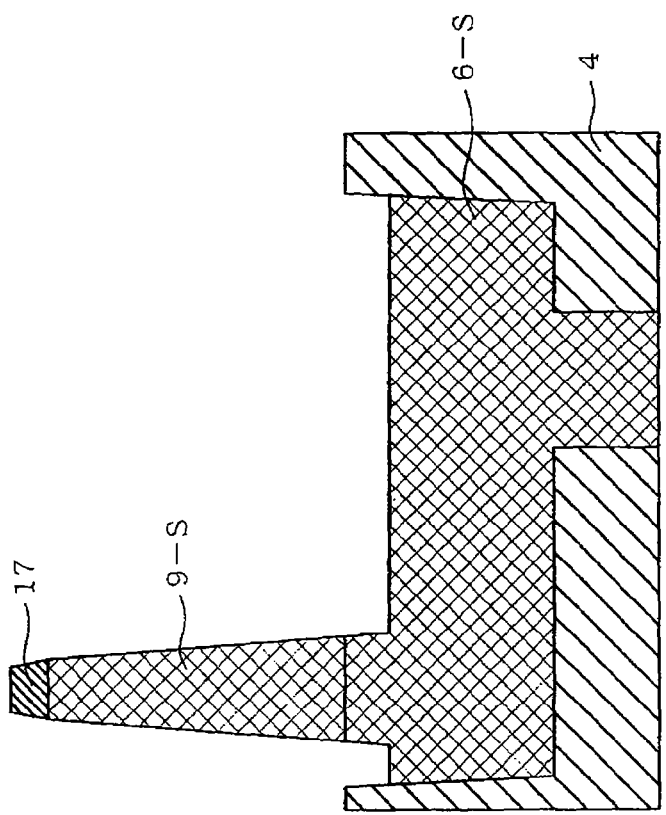
FIG. 10A is one example of a cross sectional view illustrating a structure of a semiconductor device in one phase of the manufacturing process flow.
Figure 10B:
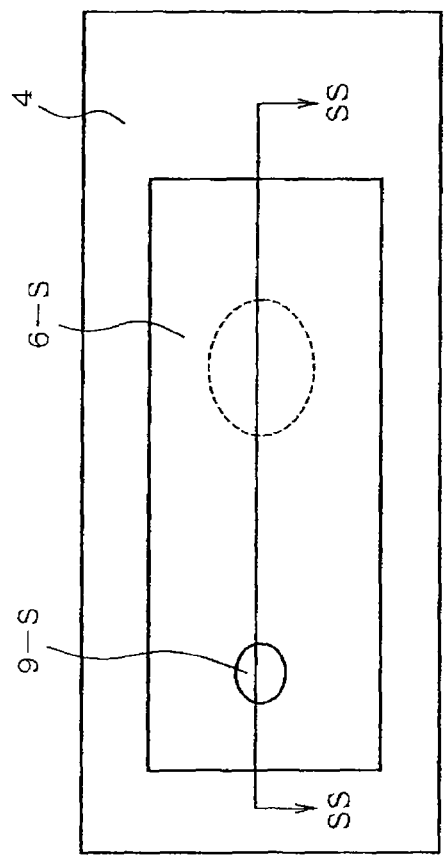
FIG. 10B is one example of a plan view of the semiconductor device in one phase of the manufacturing process flow.

A description will be given on the relation between the upper contact plug and the lower contact plug in the peripheral circuit region. FIG. 10B is one example of a plan view in the peripheral circuit region and FIG. 10A is a cross sectional view taken along line SS-SS of FIG. 10B. Conductor layer 6-S illustrated in FIG. 10A is formed of the same material as lower contact plug 6. Further, conductor layer 9-S is formed in the same process step as upper contact plug 9 and is formed of the same material. As shown in FIG. 10A, the portion of conductor layer 6-S of the peripheral circuit region which is not covered by upper contact plug 9-S is etched down by RIE. The thickness of conductor layer 6-S of the peripheral circuit region is approximately 100 nm for example. Thus, conductor layer of the peripheral circuit region remains in sufficient thickness even if it is etched down by 20 nm for example. As a result, the resistance of conductor layer 6-S is hardly increased and thus does not become a problem.

Figure 11B:
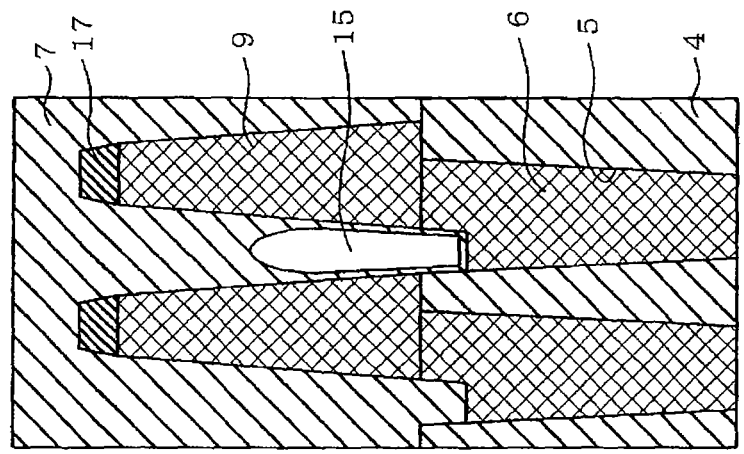
FIG. 11B corresponds to FIG. 4 and illustrates one phase of the manufacturing process flow.
Figure 11A:
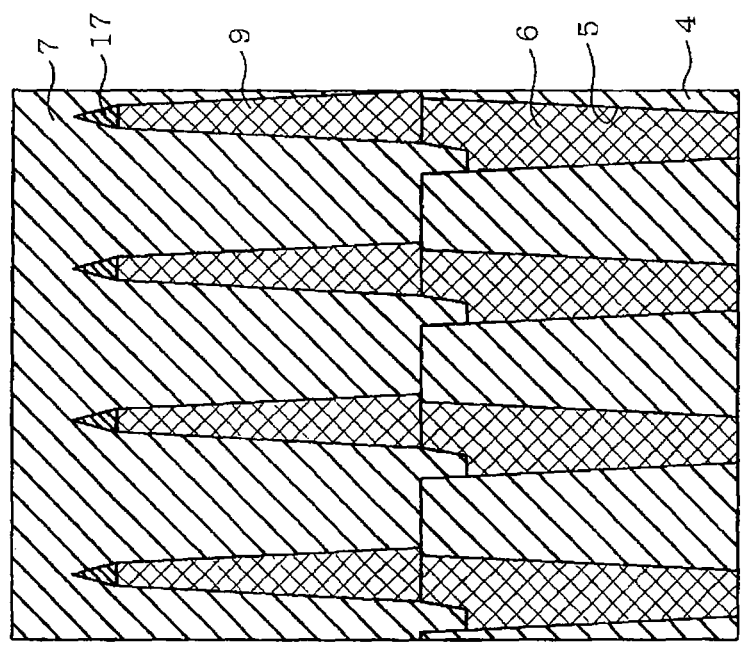
FIG. 11A corresponds to FIG. 1 and illustrates one phase of the manufacturing process flow.
Figure 12:
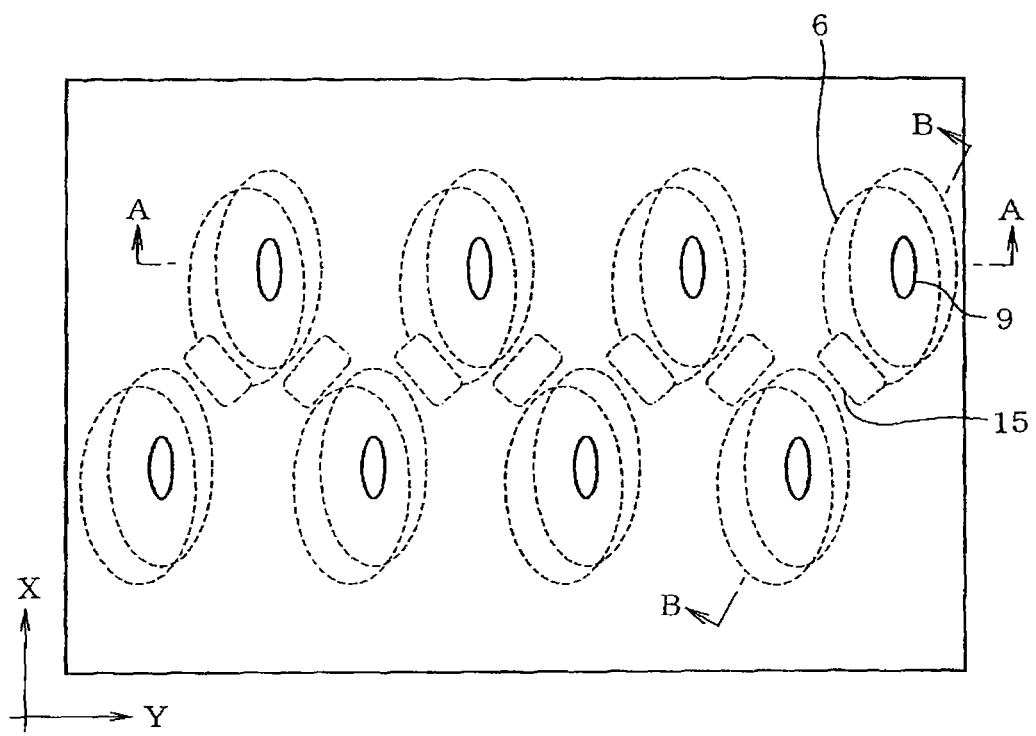
FIG. 12 is one example of a plan view of the semiconductor device in one phase of the manufacturing process flow.

Next, silicon oxide film 7 is formed as shown in FIGS. 11A, 11B, and 12. Because silicon oxide film 7 is formed under conditions providing poor coverage, air gap 15 is formed in a lower portion of the region between the XY adjacent upper contact plugs 9 as shown in FIGS. 11B and 12. The upper end of air gap 15 is lower than the upper surface of upper contact plug 9. Thus, it is unlikely that the upper portion of air gap 15 will be opened in the damascene processing of the wiring layer 13 or the like performed later in the process flow. Further, air gap 15 is not formed at step 6a located between lower contact plugs 6 adjacent in the Y direction. This is because the distance between upper contact plugs 9 adjacent in the Y direction is large. Exceptionally, air gap 15 may be formed at step 6a located between upper contact plugs 9 adjacent in the Y direction. In such case, air gap 15 formed between upper contact plugs 9 adjacent in the Y direction is smaller than air gap 15 formed between XY adjacent contact plugs 9.

Figure 13B:
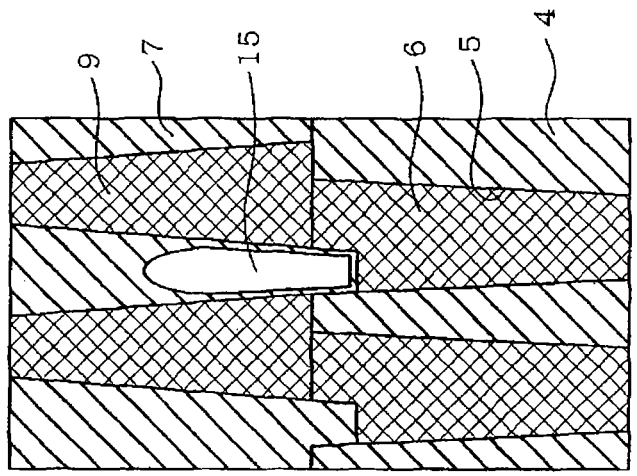
FIG. 13B corresponds to FIG. 4 and illustrates one phase of the manufacturing process flow.
Figure 13A:
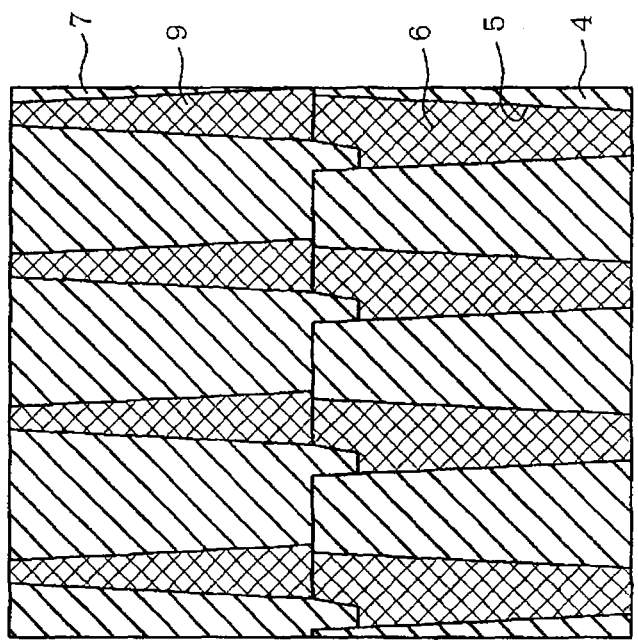
FIG. 13A corresponds to FIG. 1 and illustrates one phase of the manufacturing process flow.
Figure 14:
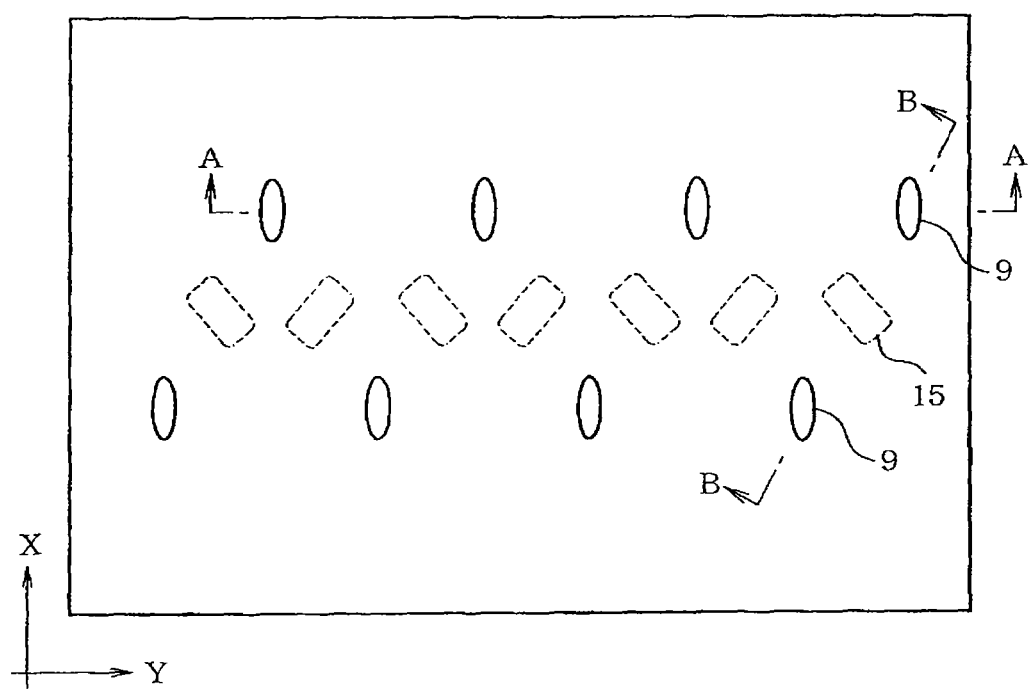
FIG. 14 is one example of a plan view of the semiconductor device in one phase of the manufacturing process flow.

Then, as shown in FIGS. 13A and 13B and 14, silicon oxide film 7 and SiN film 17 are planarized by CMP to expose the upper surface of upper contact plug 9. Thereafter, SiN film 10 and silicon oxide film 11 are formed by known processes and wiring layer 13 (damascene wiring) connecting to upper contact plug 9 is formed by damascene process. Then, SiN film 14 is formed above silicon oxide film 11 and wiring layer 13 as shown in FIG. 1.

In the above described first embodiment, upper contact plug 9 is reverse tapered and thus, the distance between upper contact plug 9 and wiring layer 13 adjacent in the Y direction can be increased. As a result, it is possible to improve the breakdown voltage between the two and consequently suppress leakage current.

Further, because the size of upper contact plug 9 increases toward its lower portion, the distance between the lower end portion of upper contact plug 9 and the upper end portion of XY adjacent lower contact plug 9 becomes close. However, step 6a, being self aligned with upper contact plug 9, is formed in the upper surface of lower contact plug 6. As a result, in the region between upper contact plug 9 and XY adjacent lower contact plug 6, vertical distance can be secured from the main plane of the semiconductor substrate. Thus, it is possible to improve the breakdown voltage.

Further, it is possible to reduce the parasitic capacitance between upper contact plug 9 and the XY adjacent lower contact plug 6. As a result, it is possible to accelerate the operation of a nonvolatile semiconductor storage device.

The lower portion of air gap 15 is lower in elevation compared to the upper surface of lower contact plug 6. Thus, it is possible to reduce the parasitic capacitance between upper contact plug 9 and the XY adjacent lower contact plug 6.

Further, air gap 15 is not formed between upper contact plugs 9 adjacent in the Y direction. As a result, when CMP is carried out later in the process flow, it is possible to improve mechanical strength by CMP and prevent pattern collapse.

(Second Embodiment)

FIGS. 15 to 28 illustrate a second embodiment. Elements identical to those of the first embodiment are identified with identical reference symbols. In the second embodiment, air gap 21 is formed in the outer periphery of the upper end portion of upper contact plug 20 (third contact plug). The second embodiment will be described in detail in the following.

In EXAMPLE 1 of the second embodiment, short diameter d1 (the diametric dimension in the Y direction) of the upper end portion of upper contact plug 20 is greater than width d2 (the width dimension in the Y direction) of the lower end portion of wiring layer 13. Upper contact hole 25 is formed through silicon oxide film 24 serving as a second insulating film. Along the inner surface of upper contact hole 25, SiCN film for example is formed which serves as spacer 26. Conductive material such as tungsten (W) is filled in the inner side of spacer 26 to form upper contact plug 20. Further, wiring layer 13 includes barrier metal 22 such as Ti formed along the inner surface of trench 12 and conductive material 23 such as Cu filled in trench 12.

Further, the under surface of wiring layer 13 which does not have upper contact plug 20 formed below it is lower in elevation compared to the upper surface of upper contact plug 20 adjacent in the Y direction.

Figure 15:
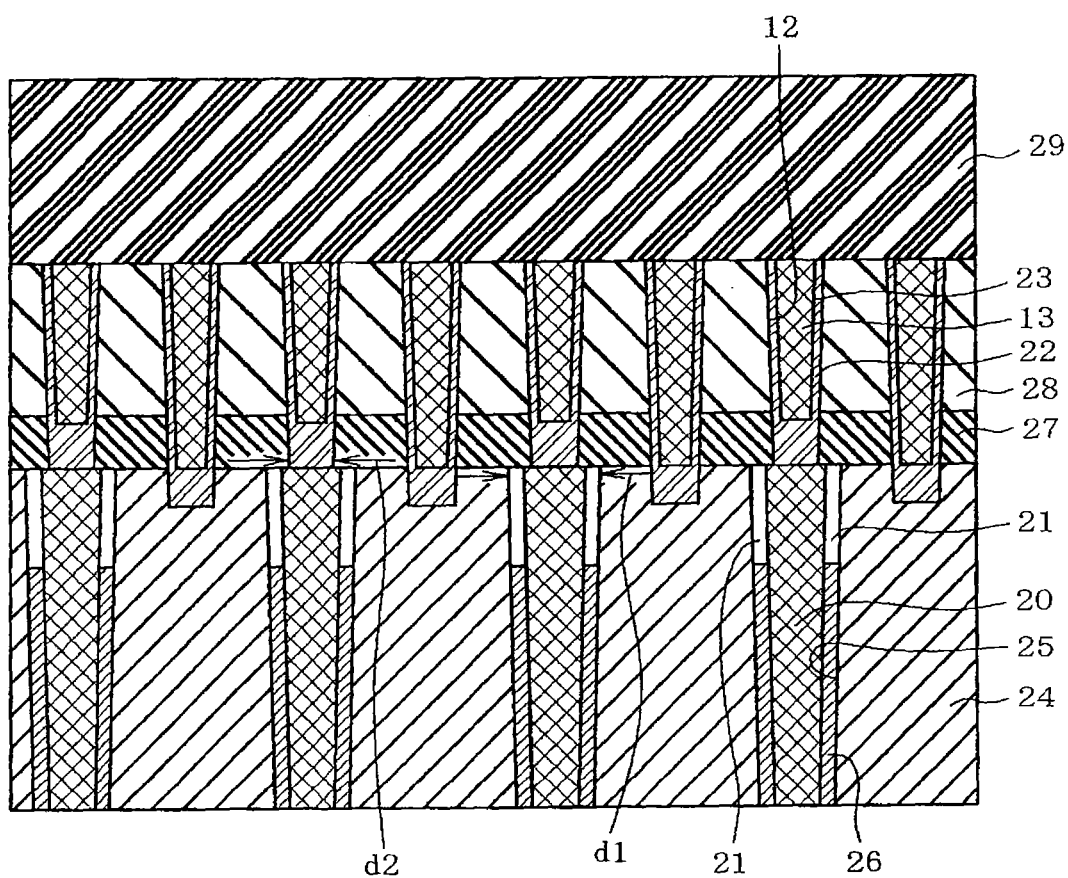
FIG. 15 corresponds to FIG. 1 and illustrates EXAMPLE 1 of a second embodiment.

As shown in FIG. 15, in the Y direction, upper side portions of the upper portion of the upper contact plug and upper side portions of the upper portion of spacer 26 contacting said upper side portions of upper contact plug 20 are displaced from the lower portion of wiring layer 13. The upper side portions of upper contact plug 20 are displaced for example in the above described manner when lithography misalignment is relatively small at the formation of trench 12 of wiring layer 13.

Figure 16:
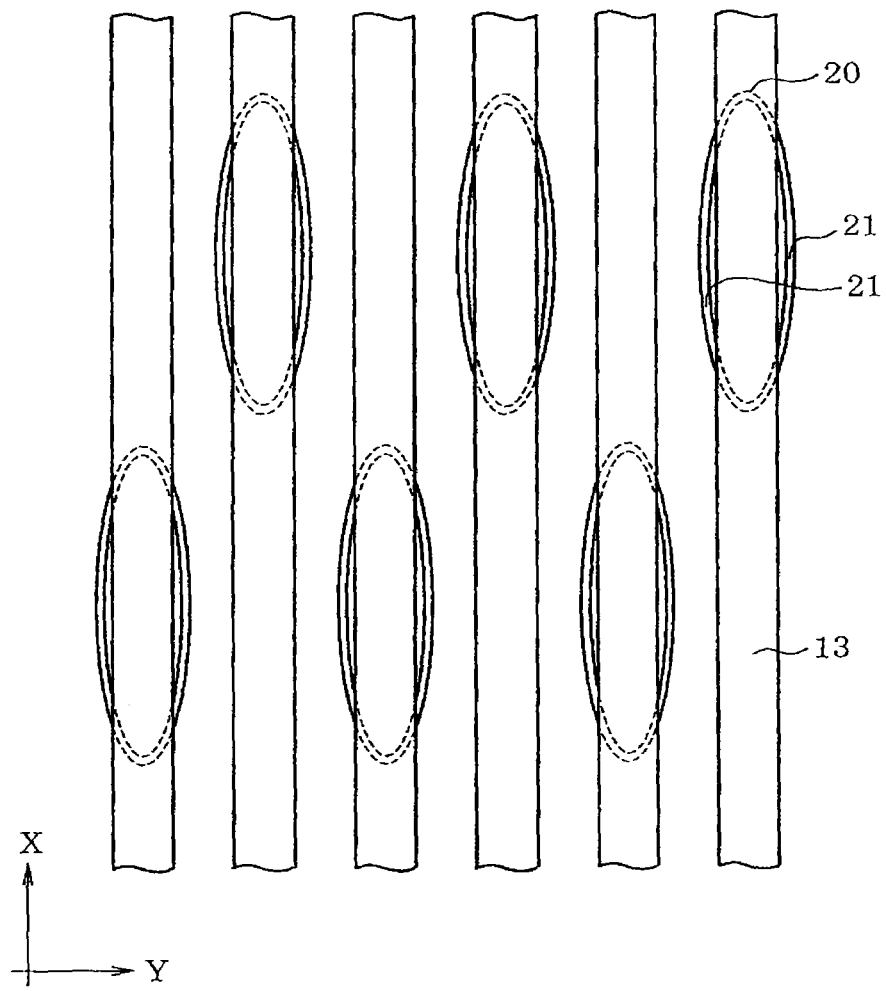
FIG. 16 corresponds to FIG. 2.

As shown in FIGS. 15 and 16, air gap 21 is formed above spacer 26 displaced from wiring layer 13. In such structure, air gap 21 is located between the lower portion of wiring layer 13 and the upper side portions (projecting portions) in the Y direction. Further, the height of the upper end of air gap 15 is substantially equal to the height of the upper end of upper contact plug 20. Further, the upper end of air gap 15 is higher than the under surface of the adjacent wiring layer 13. Still further, the lower end of air gap 15 is lower than the under surface of the adjacent wiring layer 13.

Figure 17:
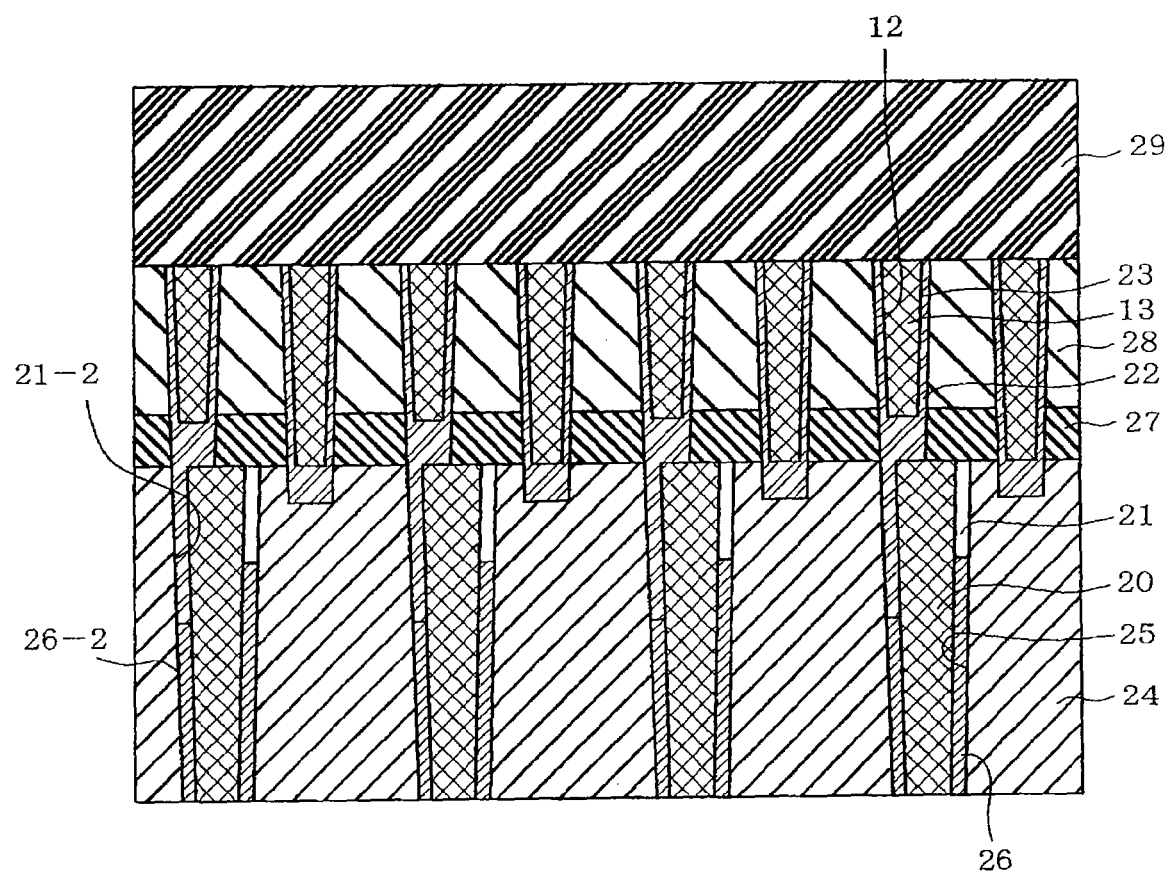
FIG. 17 corresponds to FIG. 15 and illustrates EXAMPLE 2 of a second embodiment.
Figure 18:
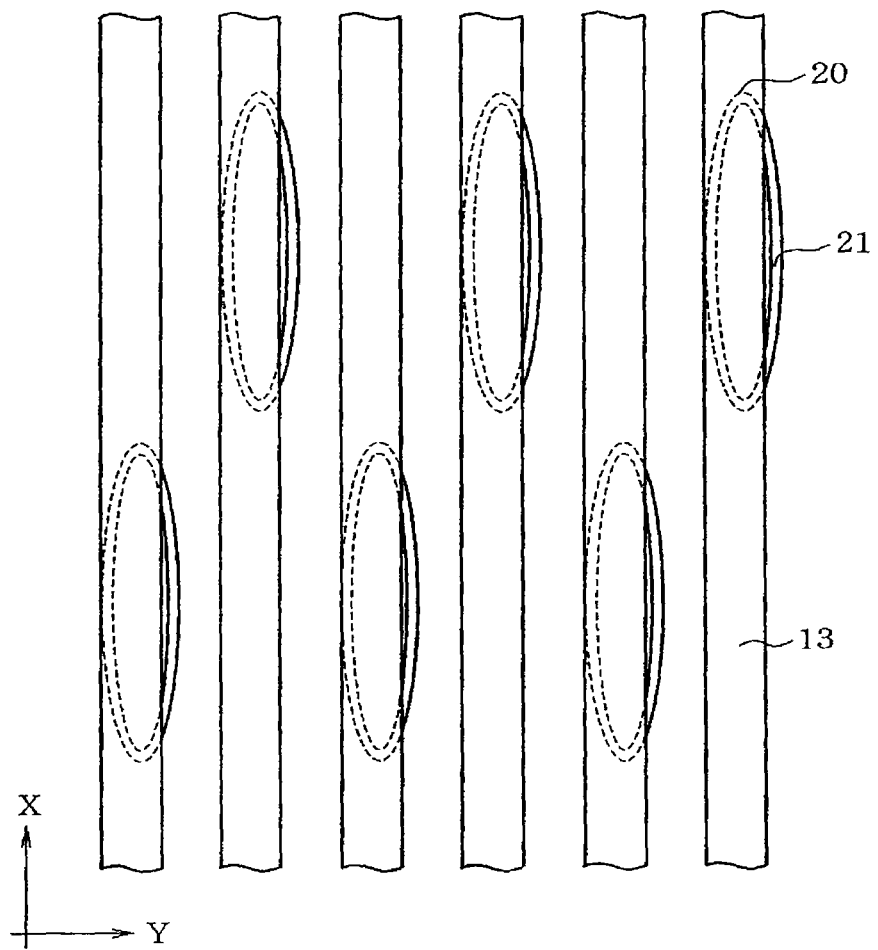
FIG. 18 corresponds to FIG. 16.

Further, EXAMPLE 2 of the second embodiment will be described with reference to FIGS. 17 and 18. In EXAMPLE 2, a side portion of the upper end portion of one side (right side) in the Y direction of upper contact plug 20 is displaced from the side portion of the lower end portion of wiring layer 13 as shown in FIG. 18. As shown in FIGS. 17 and 18, air gap 21 is formed above spacer 26 displaced from wiring layer 13. In such structure, air gap 21 is formed between the lower portion of wiring layer 13 and one of the side portion (projecting portion) of the upper portion of upper contact plug 20 in the Y direction. Wiring layer 13 is formed above spacer 26-2 formed at a side portion of the upper end portion of upper contact plug 20 formed at the remaining other side (left side) in the Y direction of upper contact plug 20. The upper surface of spacer 26-2 is lower than the upper surface of upper contact plug 20. Space 21-2 is formed which is surrounded by silicon oxide film 24, the upper portion of spacer 26-2, and contact plug 20. Barrier metal 22 is formed so as to contact space 21-2.

Further, EXAMPLE 3 of the second embodiment will be described with reference to FIG. 19. EXAMPLE 3 is substantially identical in structure to EXAMPLE 2. EXAMPLE 3 differs from EXAMPLE 2 in that barrier metal 22 is filled in the upper portion of space 21-2 and air gap 21-3 is formed in the lower portion of space 21-2.

Figure 20:
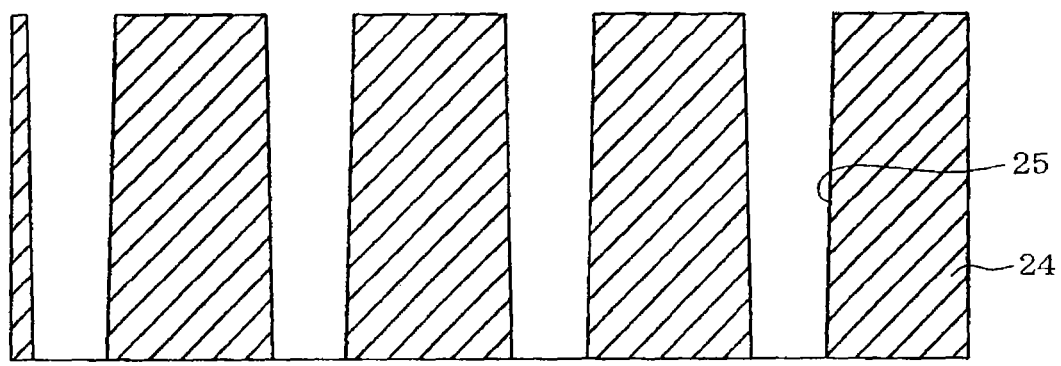
FIG. 20 corresponds to FIG. 15 in one phase of the manufacturing process flow.

Next, the manufacturing process flow of the structures of above described EXAMPLE 1 will be described with reference to FIGS. 20 to 25. As shown in FIG. 20, upper contact hole 25 is formed by processing silicon oxide film 24 by known processes. Silicon oxide film 24 is formed above the structure illustrated in FIG. 5 of the first embodiment, in other words, above silicon oxide film 7 and lower contact plug 6. Upper contact hole 25 is formed so as to expose the upper surface of lower contact plug 6.

Figure 21:
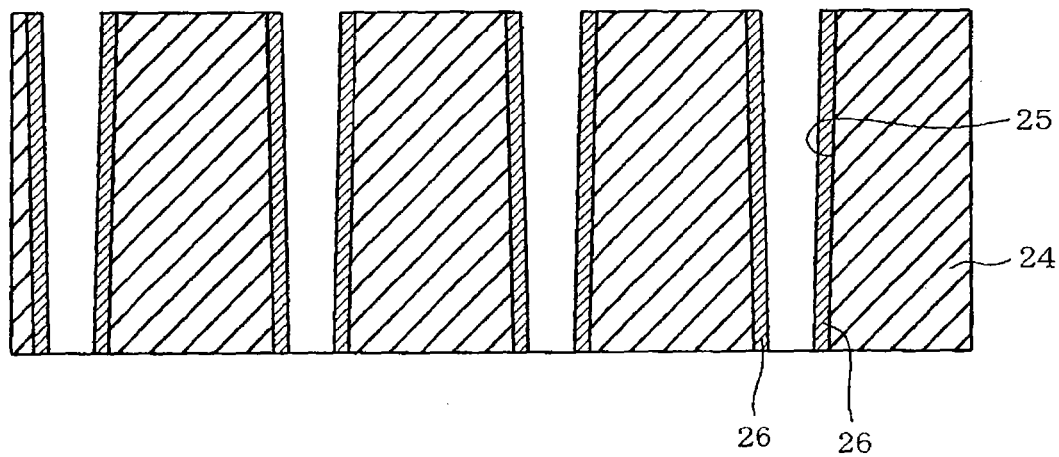
FIG. 21 corresponds to FIG. 15 in one phase of the manufacturing process flow.

Then, as shown in FIG. 21, SiCN film for example serving as spacer 26 is formed along the inner surface of upper contact hole 25 to reduce the size of the hole of upper contact hole 25. Then, spacer 26 is anisotropically etched to expose the upper surface of lower contact plug 6. SiCN film 26 may be replaced by other films as long as such films possess wet etch selectivity to silicon oxide film 24 (wet etch rate higher than the wet etch rate of silicon oxide film 24).

Figure 22:
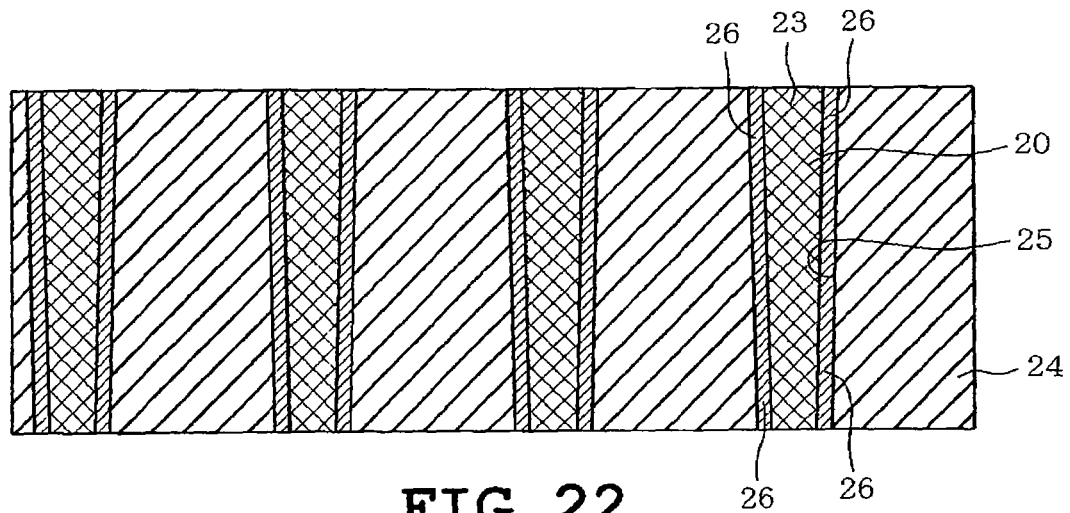
FIG. 22 corresponds to FIG. 15 in one phase of the manufacturing process flow.

Then, upper contact hole 25 is filled with conductive material 23 such as tungsten as shown in FIG. 22. Then, the structure is planarized by CMP to expose the upper surface of silicon oxide film 24 and form upper contact plug 20 inside upper contact hole 25. The height of the upper surface of upper contact plug 20 is substantially equal to the height of the upper surface of spacer 26. The structure illustrated in FIG. 22 is formed in the above described manner.

Figure 23:
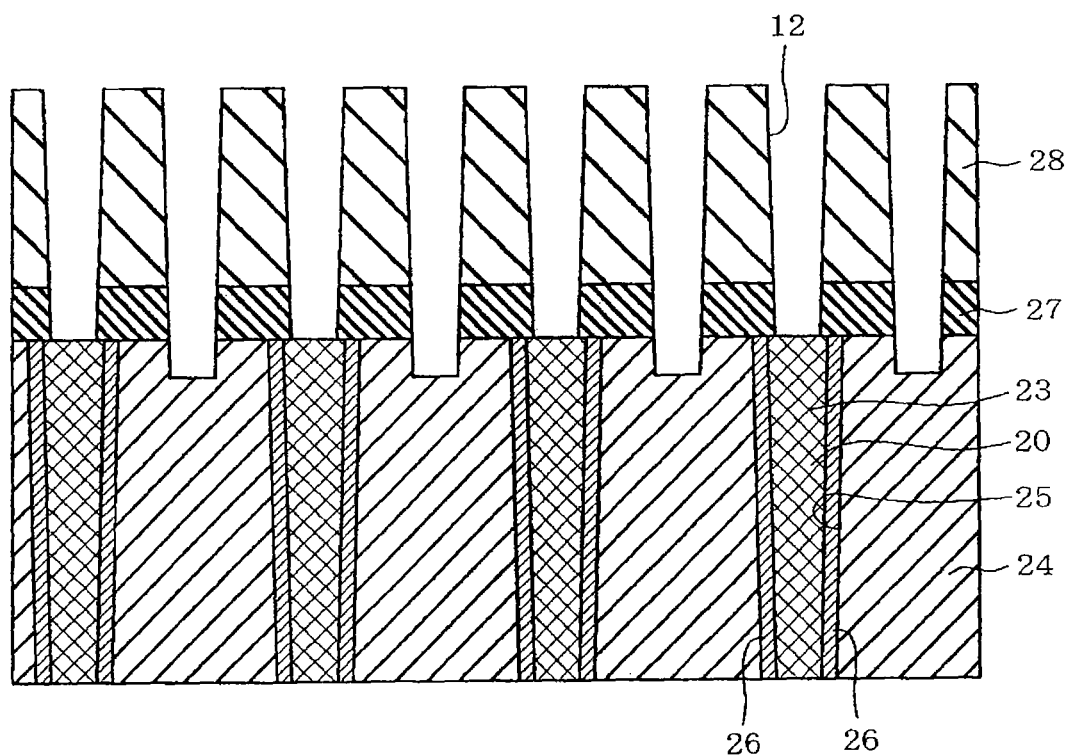
FIG. 23 corresponds to FIG. 15 in one phase of the manufacturing process flow.

Then, as shown in FIG. 23, SiN film 27 and silicon oxide film 28 serving as an insulating layer are stacked above silicon oxide film 24, SiCN layer 26, and conductive material 23. Thereafter, trench 12 for forming wiring layer 13 is formed by processing SiN film 27 and silicon oxide film 28 by known processes. At this instance, the upper surface of upper contact plug 20 is exposed at the bottom portion of trench 12. When upper contact plug 20 is not formed, the bottom portion of trench 12 is lower than the upper surface of silicon oxide film 24 by over etching. The structure illustrated in FIG. 23 is formed in the above described manner.

Figures 24A, 24B:
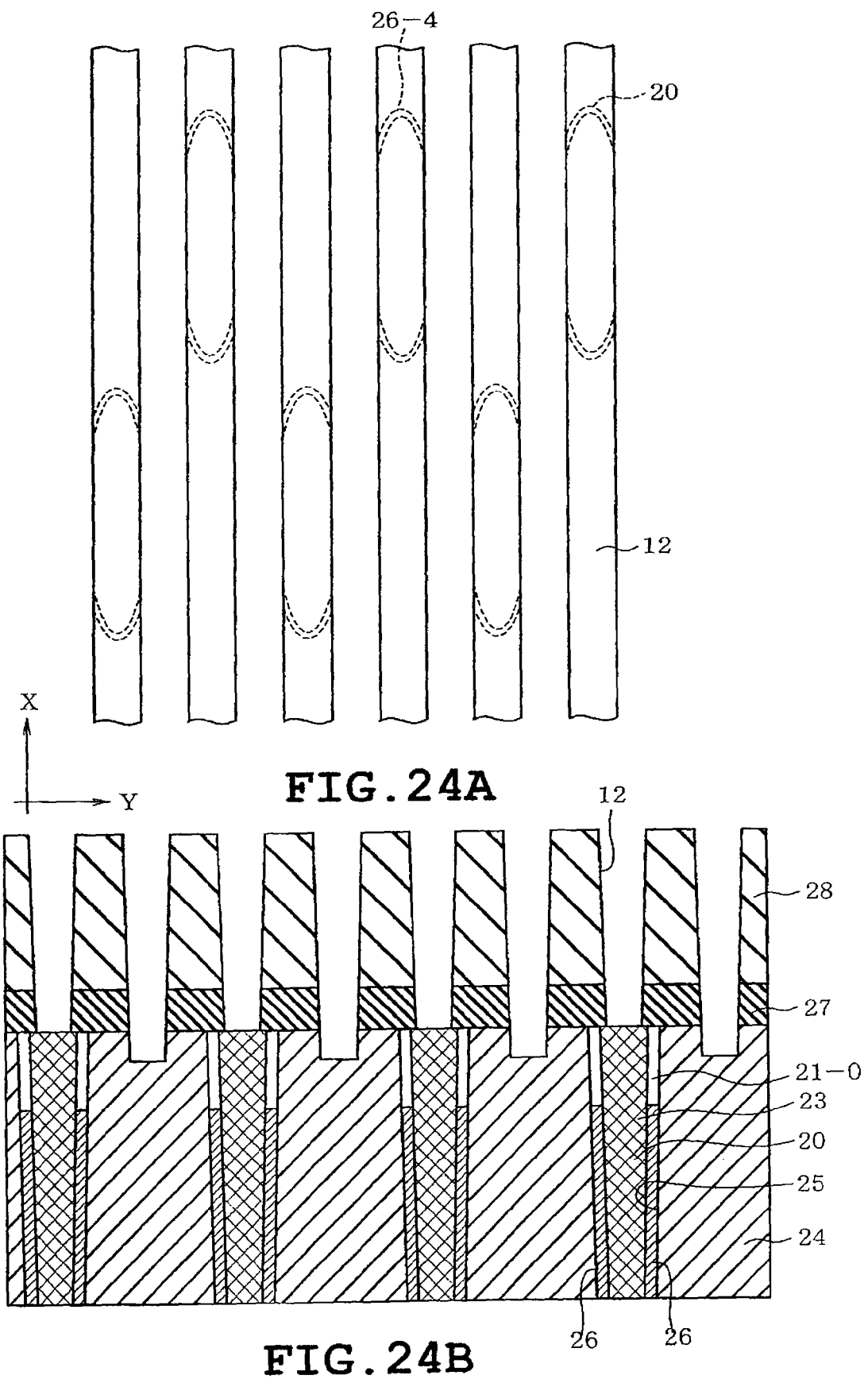
FIG. 24A corresponds to FIG. 16 in one phase of the manufacturing process flow.
FIG. 24B corresponds to FIG. 15 in one phase of the manufacturing process flow.

Then as shown in FIGS. 24A and 24B, wet etching is carried out for after treatment and removing oxides from upper contact plug 20. Etchants such as alkali-based solutions are used in the wet etching. As shown in FIG. 24A, upper portion of spacer 26-4 exposed by trench 12 is partially removed by the wet etching. The wet etch liquid permeates from spacer 26-4 to spacer 26 formed along the outer periphery of the upper portion of upper contact plug 20 and forms space 21-0. Only SiCN film along both outer peripheral sides of the upper end portion of upper contact plug 20 is removed by the difference in the wet etch selectivity ratio between upper contact plug 20 and spacer 26. To prevent pattern collapse, only the upper portion of spacer 26 is etched so that air gap 21 is formed only along the outer periphery of the upper portion of upper contact plug 20.

Figure 25:
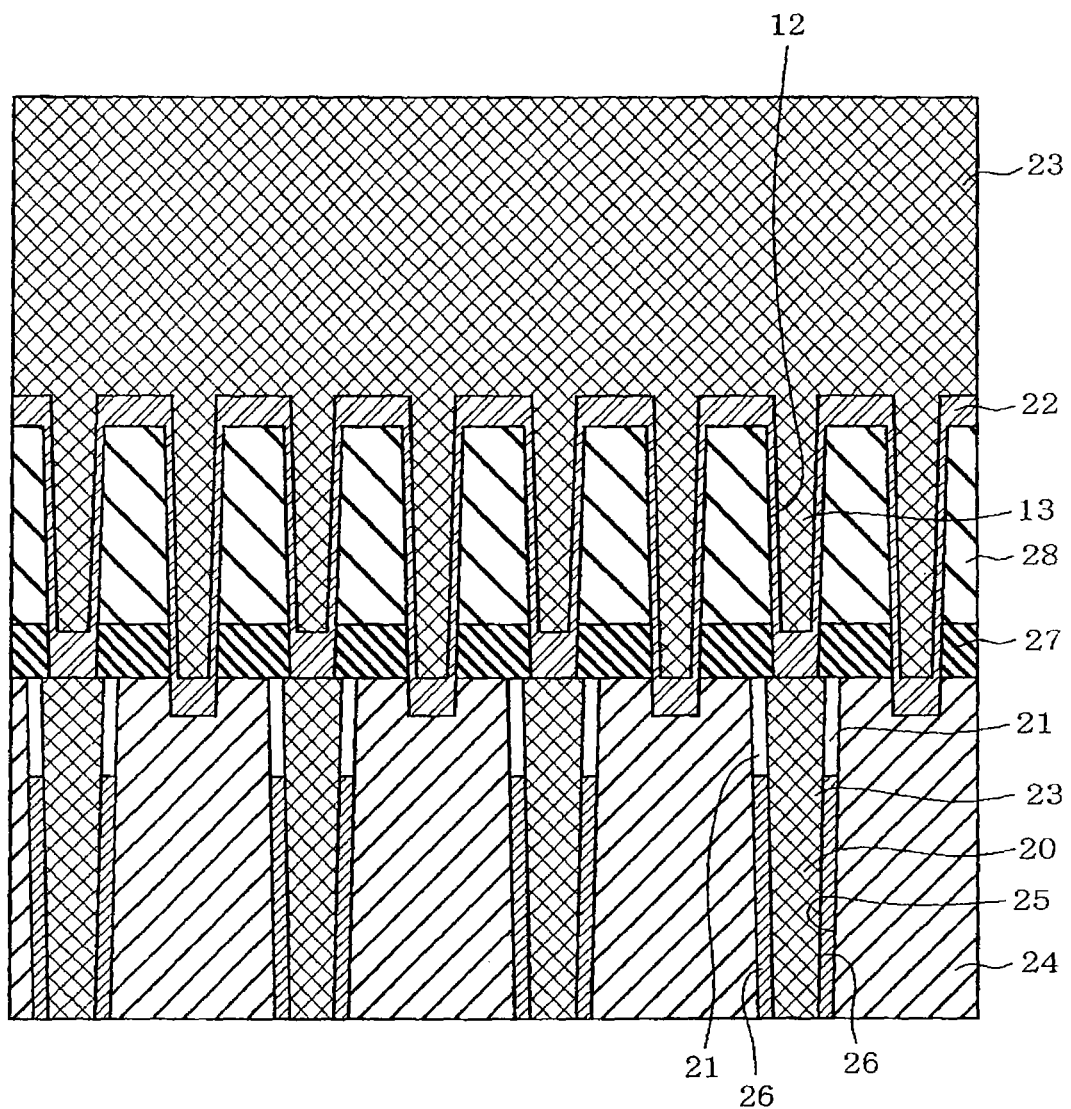
FIG. 25 corresponds to FIG. 15 in one phase of the manufacturing process flow.

Then, as shown in FIG. 25, barrier metal 22 such as TiN is formed along the inner surface of trench 12 by sputtering. Barrier metal 22 is formed in space 21-0 above spacer 26-4 illustrated in FIG. 24A. SiN film 27 is formed above the upper surfaces of spaces 21-0 located at both outer peripheral sides of the upper portion of upper contact plug 20. As a result, a barrier metal is not formed in spaces 21-0 located at both outer peripheral sides of the upper portion of upper contact plug 20. Thus, space 21-0 above spacer 26-4 is enclosed by the barrier metal and air gaps 21 are formed at both outer peripheral sides of the upper portion of upper contact plug 20. Then, trench 12 is filled with conductive material 23 such as Cu by plating. The structure illustrated in FIG. 25 is formed in the above described manner.

Then, as shown in FIG. 15, conductive material 23 is planarized by CMP to expose the upper surface of silicon oxide film 28 and form wiring layer 13 in trench 12. Further, SiN film 29 for example serving as an insulating film is formed above the upper surface of silicon oxide film 28 and wiring layer 13. The structure illustrated in FIG. 15 is formed in the above described manner.

Figure 26A:
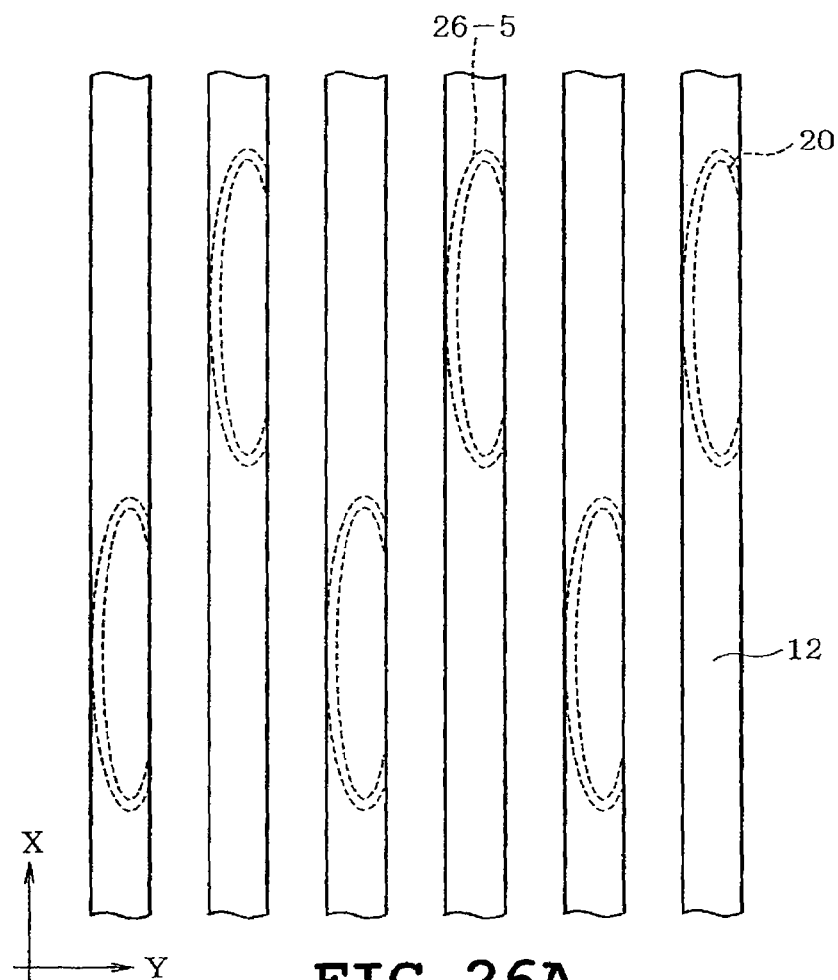
FIG. 26A corresponds to FIG. 18 in one phase of the manufacturing process flow.
Figure 26B:
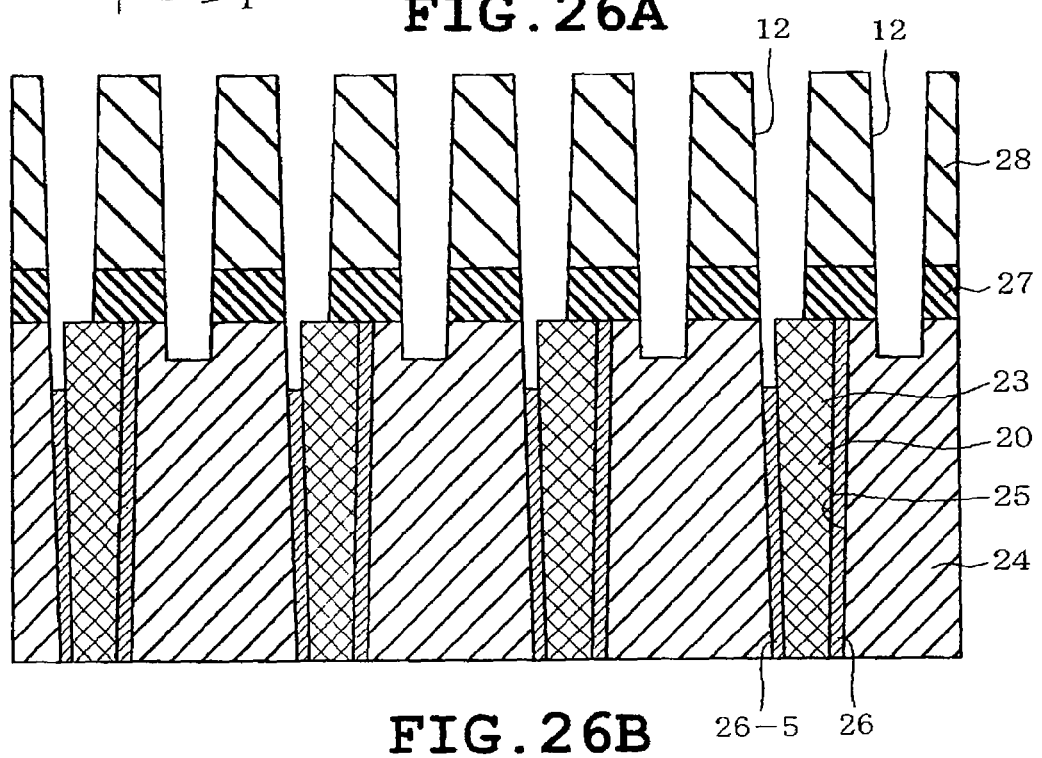
FIG. 26B corresponds to FIG. 17 in one phase of the manufacturing process flow.

Next, a description will be given on the manufacturing process flow of EXAMPLES 2 and 3 with reference to FIGS. 26A to 28. The process flow from FIG. 20 to 22 is the same the process flow of the first embodiment. Thereafter, as shown in FIG. 26B, SiN film 27 and silicon oxide film 28 serving as an insulating layer is stacked above silicon oxide film 24, conductive material 23, and spacer 26. Then, trench 12 for forming wiring layer 13 is formed by processing SiN film 27 and silicon oxide film 28 by known processes. In the example shown in FIG. 26A, trench 12 is displaced toward the right side in the Y direction with respect to upper contact plug 20 by misalignment. Thus, the left half of spacer 26 (spacer 26-5) is substantially exposed at the bottom portion of trench 12. The structure illustrated in FIGS. 26A and 26B are formed in the above described manner. When the lithography misalignment at the formation of trench 12 is relatively large, one of the side portions (the right side) of the upper portion of upper contact plug 20 projects with respect to the lower end portion of trench 12 (that is, wiring layer 13).

Figure 27:
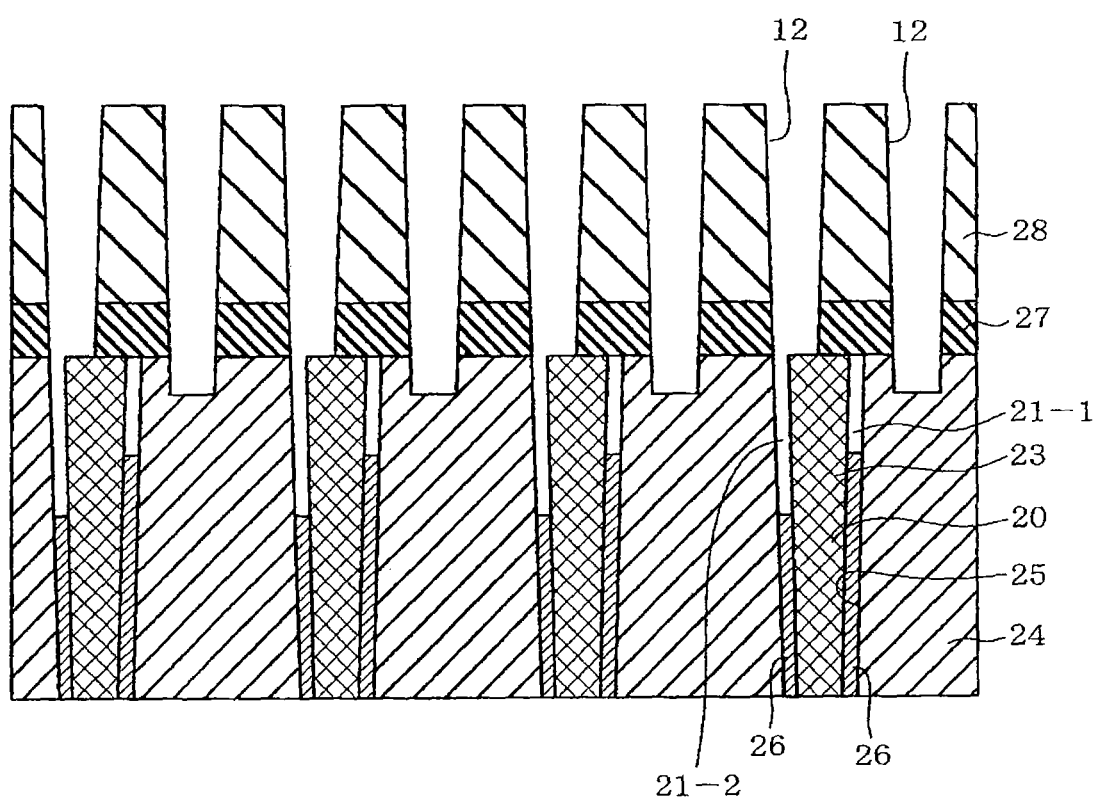
FIG. 27 corresponds to FIG. 17 in one phase of the manufacturing process flow.

Then as shown in FIG. 27, wet etching is carried out for after treatment and removing oxides from upper contact plug 20. Upper portion of spacer 26-5 exposed by trench 12 is partially removed by the wet etching and space 21-2 is formed. The wet etch liquid permeates from spacer 26-5 to spacer 26 formed along the outer periphery of the upper portion of upper contact plug 20 and forms space 21-1. Only SiCN film along both outer peripheral sides of the upper portion of upper contact plug 20 is removed by the difference in the wet etch selectivity ratio between upper contact plug 20 and spacer 26. Spacer 26 located in the portion covered by SiN film 27 is removed by side etching. Thus, the depth of space 21-1 located in the portion covered by SiN film 27 is less than the depth of space 21-2.

Figure 28:
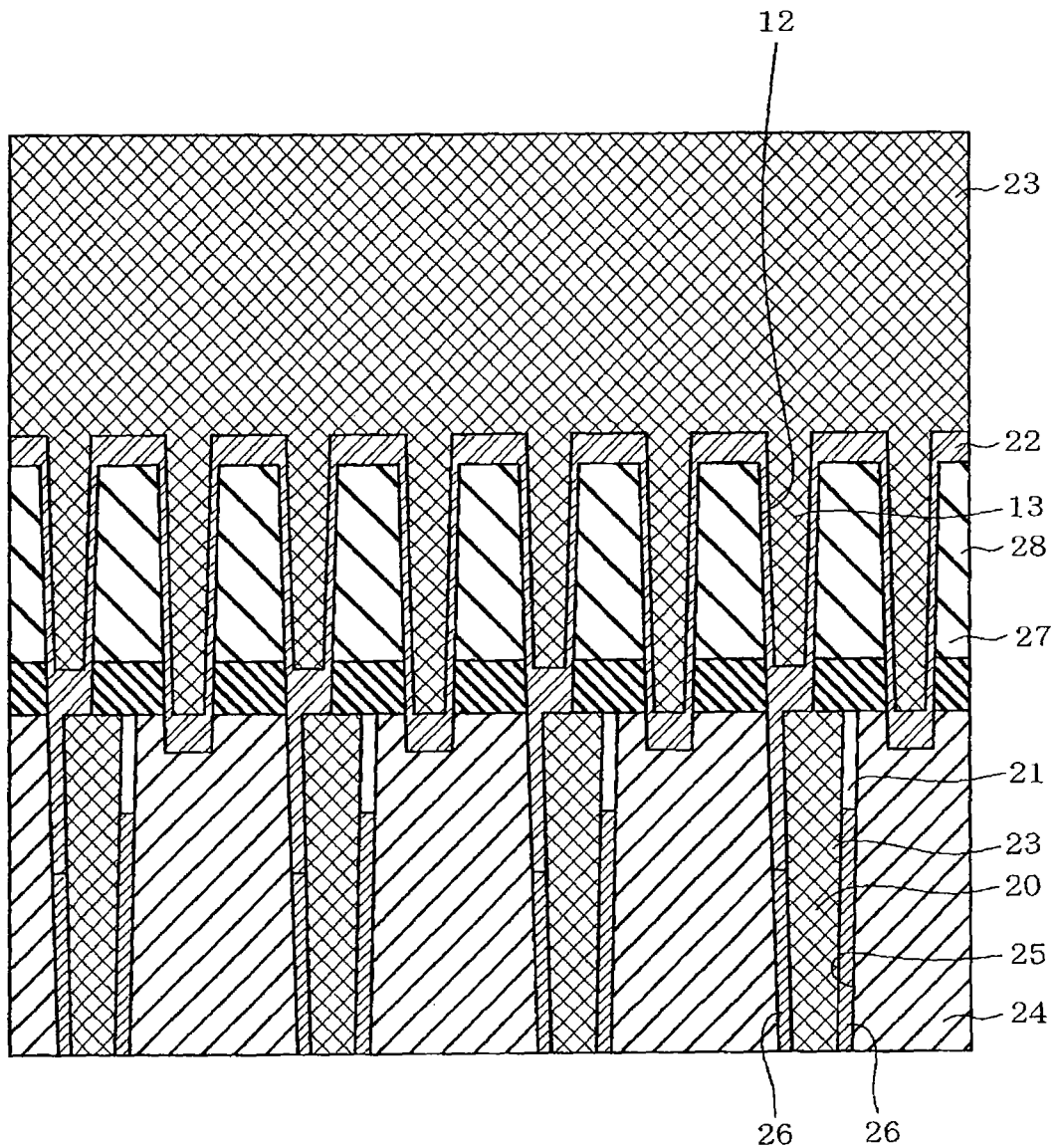
FIG. 28 corresponds to FIG. 17 in one phase of the manufacturing process flow.

Then, as shown in FIG. 28, barrier metal 22 such as TiN is formed along the inner surface of trench 12 by sputtering. Barrier metal 22 is formed in space 21-2. SiN film 27 is formed above the upper surface of space 21-1 located at the outer peripheral portion of the upper portion of upper contact plug 20. As a result, a barrier metal is not formed in space 21-1 located at outer peripheral portion of the upper portion of upper contact plug 20. Thus, space 21-1 is enclosed by the barrier metal and air gap 21 is formed at one of the outer peripheral sides of the upper portion of upper contact plug 20. When space 21-2 is completely filled with barrier metal 22, the structure of EXAMPLE 2 (see FIG. 17) is obtained. When the upper portion side of space 21-2 is filled with barrier metal 22, air gap 21-3 is formed below the filled barrier metal 22 to obtain the structure of EXAMPLE 3 (see FIG. 19). Then, trench 12 is filled with conductive material 23 such as Cu by plating. The structure illustrated in FIG. 28 is formed in the above described manner.

Figure 19:
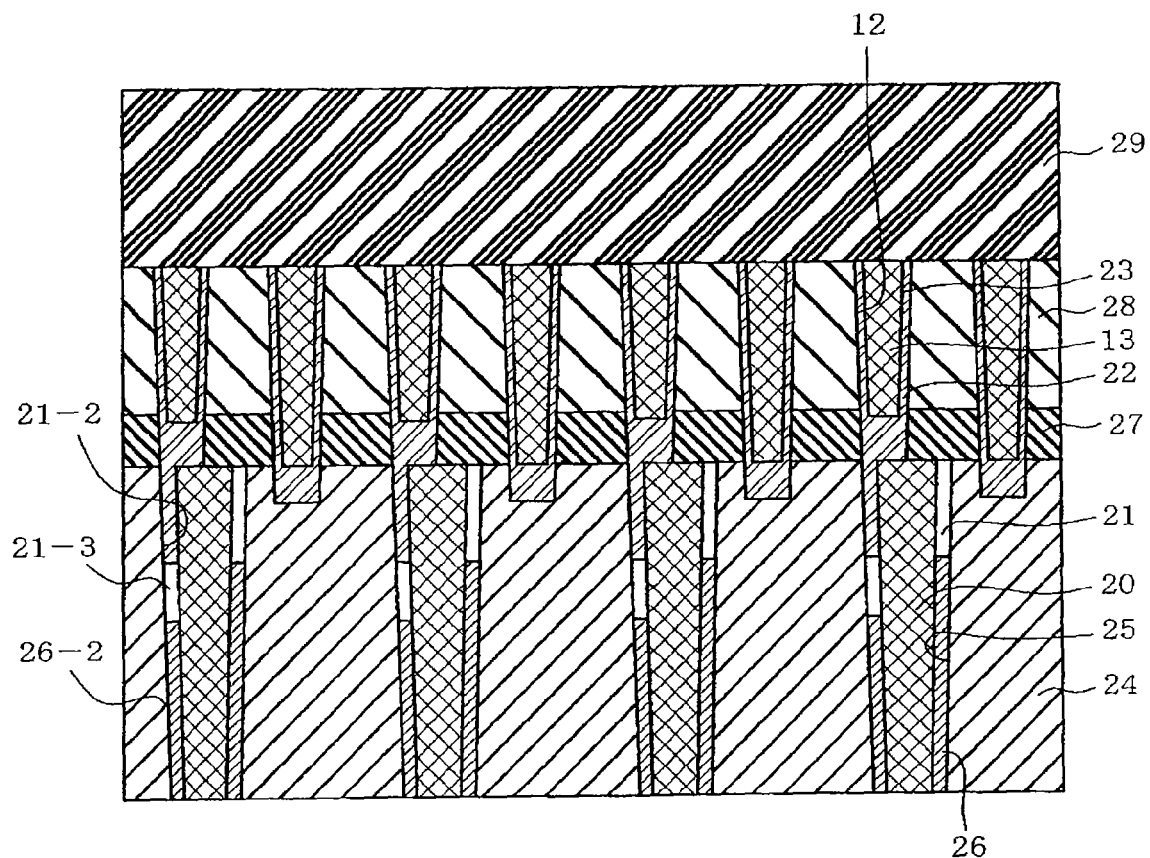
FIG. 19 corresponds to FIG. 15 and illustrates EXAMPLE 3 of the second embodiment.

Thereafter, wiring layer 13 is formed in trench 12 by, for example, planarizing conductive material 23 by CMP and exposing the upper surface of silicon oxide film 28 as shown in FIG. 17 (or FIG. 19). Then, SiN film 29 for example serving as an insulating film is formed above silicon oxide film 28 and wiring layer 13. The structure illustrated in FIG. 17 (or FIG. 19) is formed in the above described manner to obtain the structure of EXAMPLE 2 (or EXAMPLE 3).

In EXAMPLE 1 of the second embodiment, air gap 21 is formed above spacer 26 displaced from wiring layer 13. Air gap 21 is disposed between both side portions (projecting portions) of the upper portion of upper contact plug 20 and the lower portion of wiring layer 13 adjacent in the Y direction.

As a result, it is possible to increase the breakdown voltage between upper contact plug 20 and wiring layer 13 and suppress leakage current.

In EXAMPLE 2 of the second embodiment, it is possible to form air gap 21 between wiring layer 13 displaced in the vicinity of upper contact plug 20 by misalignment and upper contact plug 20. On the other hand, air gap 21 is not formed between wiring layer 13 displaced away from upper contact plug 20 by misalignment and upper contact plug 20. As a result, it is possible to increase the breakdown voltage between the upper contact plug 20 and the adjacent wiring layer 13 even when misalignment occurs. Further, it is possible to reduce the resistance of wiring layer 13 and upper contact plug 20 by filling barrier metal. Further in EXAMPLE 2, barrier metal 22 of wiring layer 13 is filled in the portion between upper contact plug 20 and wiring layer 13 even if breakdown voltage is increased by misalignment. As a result, it is possible to increase the area of connection between upper contact plug 20 and wiring layer 13 and reduce the connection resistance of the contact. Further, it is possible to obtain the operation and effect similar to those of EXAMPLE 2 by EXAMPLE 3 of the second embodiment.

(Third Embodiment)

FIGS. 29A to 34 illustrate a third embodiment. Elements identical to those of the second embodiment are identified with identical reference symbols. In the third embodiment, the upper contact plug and the wiring layer are formed at once.

Figure 29A:
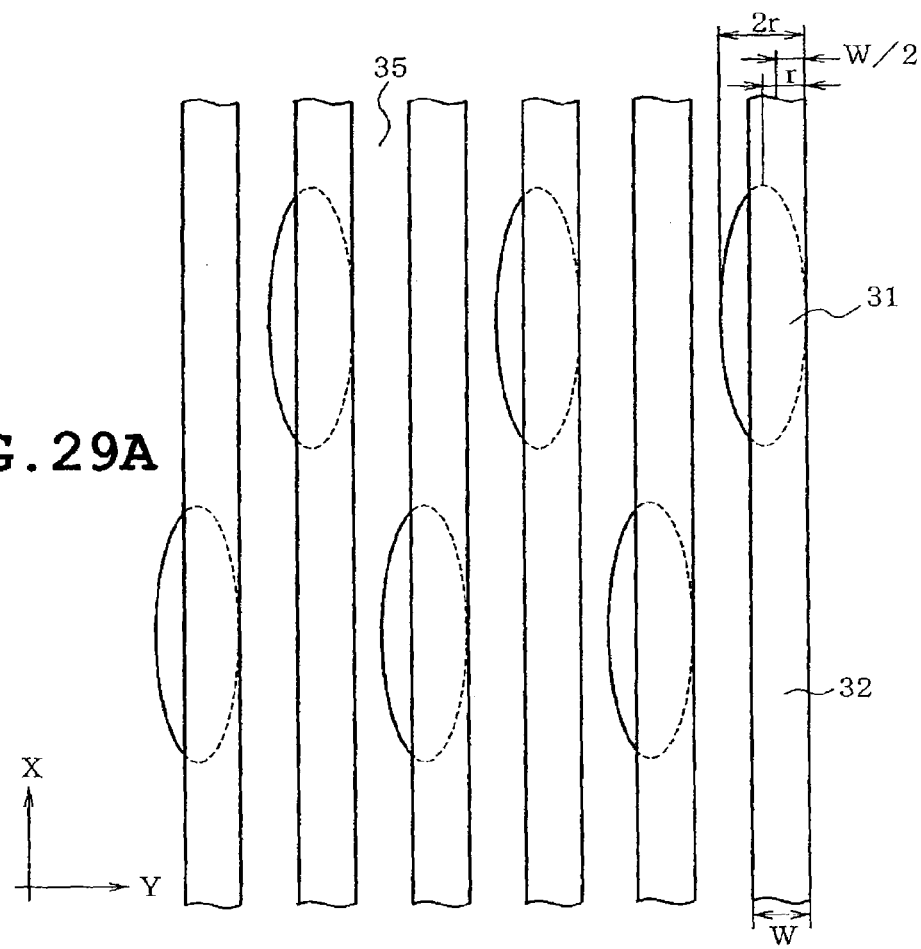
FIG. 29A corresponds to FIG. 2 and illustrates a third embodiment.
Figure 29B:
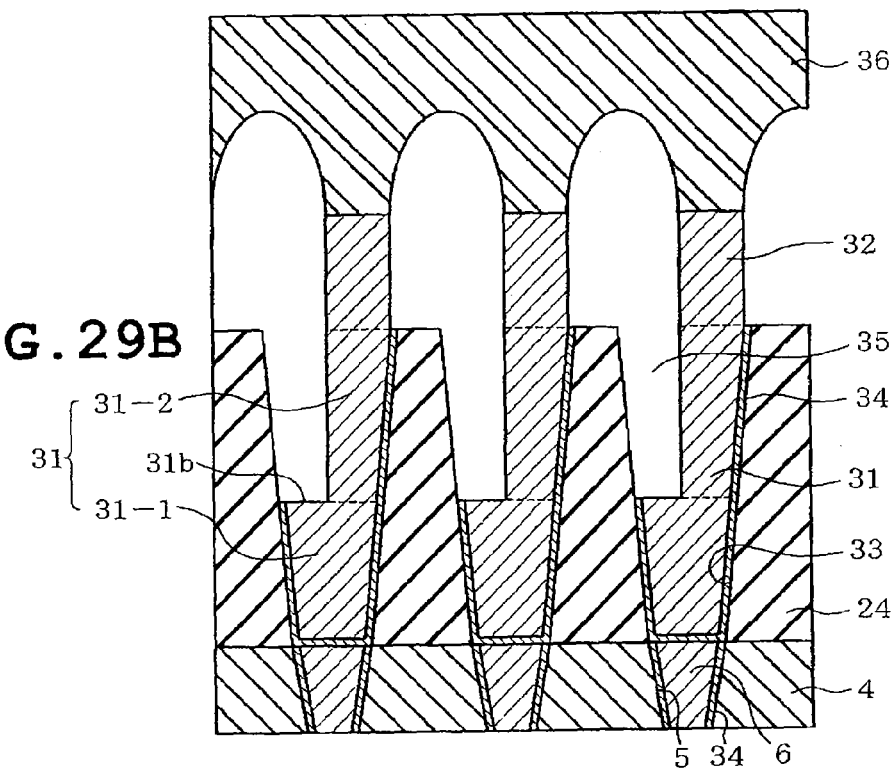
FIG. 29B corresponds to FIG. 1 and illustrates the third embodiment.

More specifically, wiring layers 32 extend in the X direction and are disposed with constant spacing between one another in the Y direction as shown in FIG. 29A. Upper contact 31 is disposed so that the Y direction left side projects with respect to wiring layer 32. Air gap 35 is formed between wiring layers 32. Air gap 35 extends in the X direction. As shown in FIG. 29B, upper contact plug 31 serving as a fourth contact plug is formed above lower contact plug 6 and wiring layer 32 is formed above upper contact plug 31. Upper contact plug 31 and wiring layer 32 are formed in one by conductive material such as tungsten. Barrier metal 34 formed of WN, TiN, or the like is formed along the inner surface of upper contact hole 33 which is filled with upper contact plug 31. Barrier metal 34 made of WN, TiN, or the like is also formed along the inner surface of lower contact hole 5 which is filled with lower contact plug 6.

Upper contact plug 31 includes lower portion 31-1 and upper portion 31-2. The width of lower portion 31-1 in the Y direction is greater than the width of upper portion 31-2. Wiring layer 32 and upper portion 31-2 may be described as being formed in a self aligned manner.

Further, air gap 35 is formed between upper contact plug 31 and the adjacent wiring layer 32. Insulating film 36 made for example of a silicon oxide film is formed above wiring layer 32. The upper end of air gap 35 is higher than the upper surface of wiring layer 32. Air gap 35 exposes the side surfaces of wiring layer 32 and upper portion 31-2 and exposes a portion of the upper surface of lower portion 31-1 in which upper portion 31-2 is not formed. The lower end of air gap 35 is formed continuously from the upper surface of silicon oxide film 24 to lower portion 31-1. It may be described that air gap 35 exposes the upper surface and the upper side surface of silicon oxide film 24.

Figure 30:
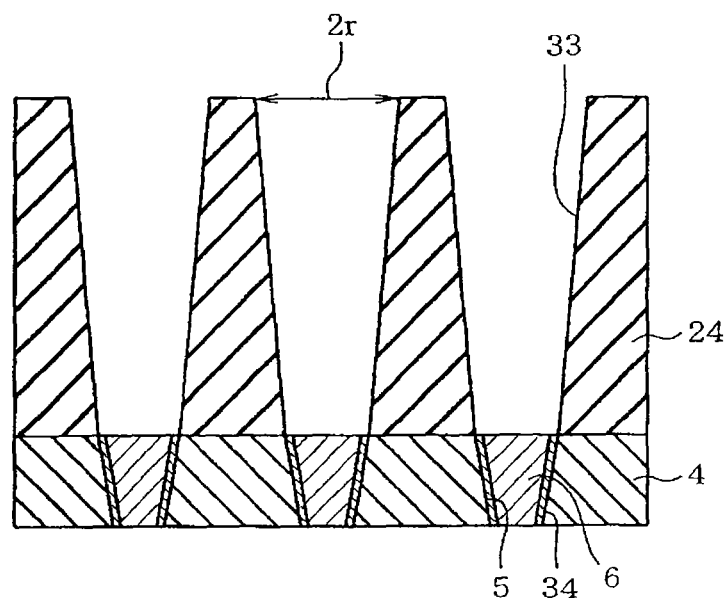
FIG. 30 corresponds to FIG. 29B in one phase of the manufacturing process flow.

Next, a description will be given on the manufacturing process flow of the above described structure with reference to FIGS. 30 to 34. First, as shown in FIG. 30, upper contact hole 33 is formed by processing silicon oxide film 24 by known processes. Silicon oxide film 24 is formed above the structure illustrated in FIG. 5 of the first embodiment, that is, above silicon oxide film 4 and lower contact plug 6. Upper contact hole 33 is formed so as to expose the upper surface of lower contact plug 6. In the above described structure, the relation represented as W/2<r<W<2r is established when: r represents the radius of upper opening (that is, diametric dimension of the upper opening is represented as 2r) and line width of wiring layer 32 is represented as W (see FIG. 29A).

Figure 31:
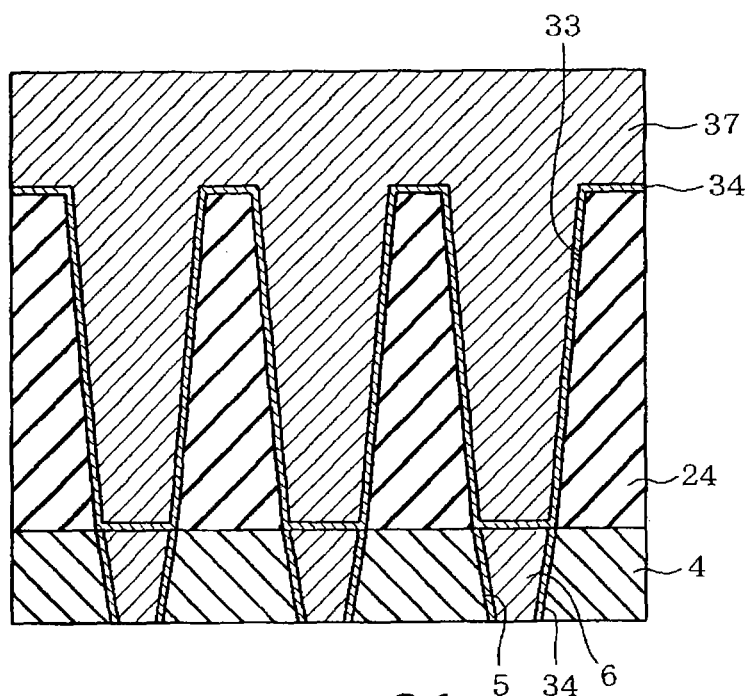
FIG. 31 corresponds to FIG. 29B in one phase of the manufacturing process flow.

Then, as shown in FIG. 31, barrier metal 34 formed of WN or TiN, or the like is formed along the inner surface of upper contact hole 33 and above the upper surface of silicon oxide film 24. Then, conductive material 37 such as tungsten or molybdenum is formed above barrier metal 34 and the upper surface of conductive material 37 is planarized by CMP so that the thickness of conductive material 37 above the upper surface of silicon oxide film 24 is equal to the thickness of wiring layer 32. The structure illustrated in FIG. 31 is formed in the above described manner.

Figure 32:
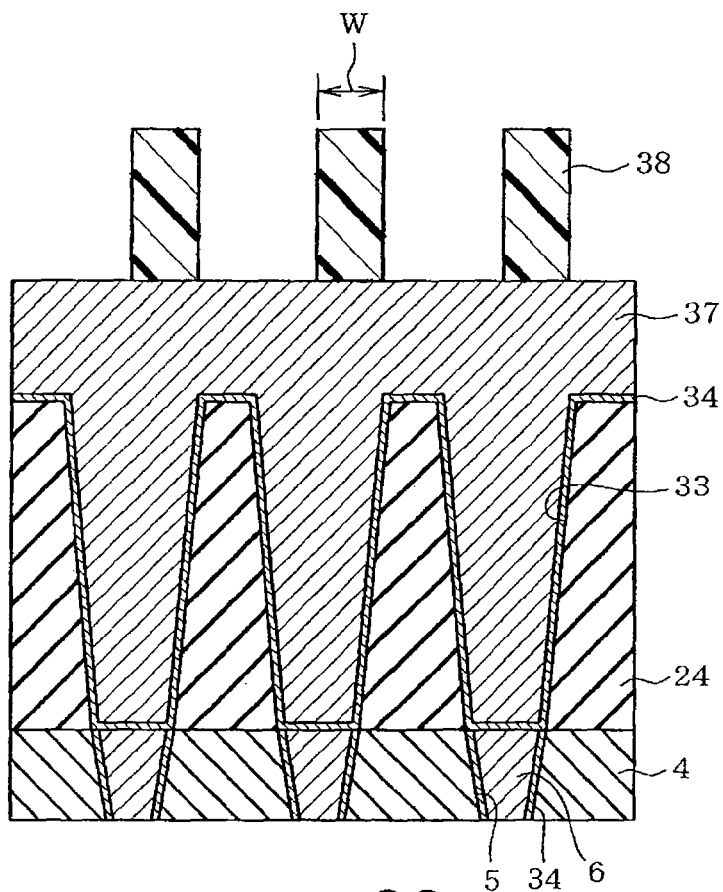
FIG. 32 corresponds to FIG. 29B in one phase of the manufacturing process flow.

Next, as shown in FIG. 32, mask pattern 38 is formed above the upper surface of conductive material 37. Mask pattern 38 is formed by forming a silicon oxide film for example serving as a hard mask film and patterning the hard mask film by photolithography. Mask pattern 38 has width W. In the third embodiment, mask pattern 38 is displaced rightward in the Y direction for example by misalignment.

Figure 33:
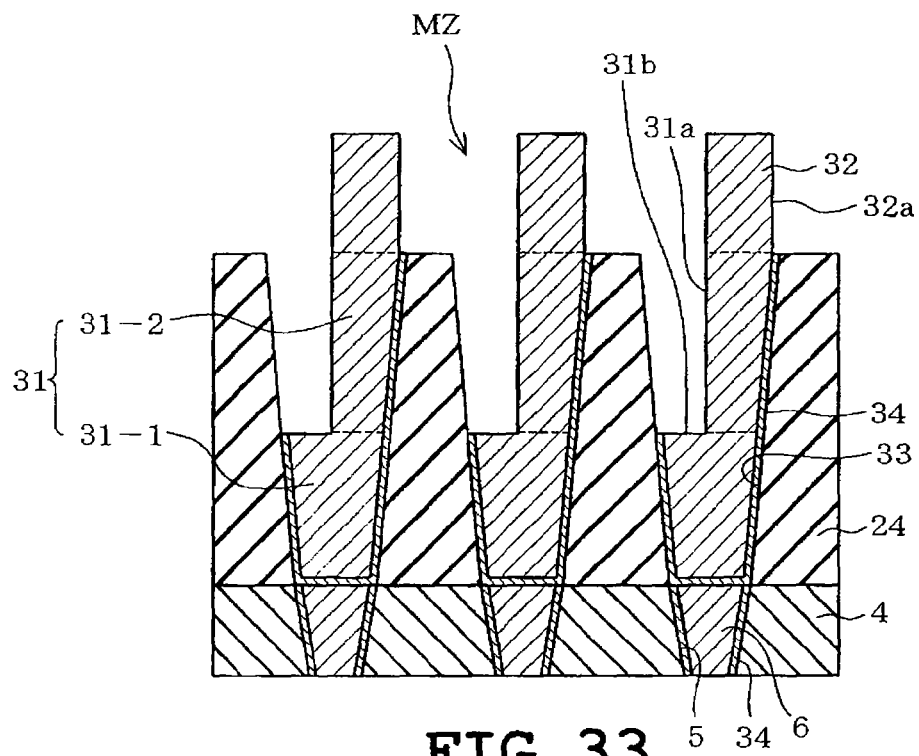
FIG. 33 corresponds to FIG. 29B in one phase of the manufacturing process flow.

Thereafter, using mask pattern 38 as a mask, trench MZ is formed by processing conductive material 37 (and barrier metal 34) by for example RIE as shown in FIG. 33. RIE is carried out so that an etch selectivity of conductive material 37 (and barrier metal 34) is higher than that of the silicon oxide film 24. Upper contact plug 31 and wiring layer 32 are formed in the above described manner. Conductive material 37 located below the upper surface of silicon oxide film 34 serves as upper contact plug 31. Further, the portion located below upper surface 31b exposed by the bottom portion of trench MZ serves as lower portion 31-1 and the portion above upper surface 31b serves as upper portion 31-2. In such structure, one side surface 31a of upper portion 31-2 and one side surface 32a of wiring layer 32 are coplanar. That is, at least one plane is formed in which one side surface 31a of upper contact plug 31 and one side surface 32a of wiring layer 32 exist on the same plane.

Figure 34:
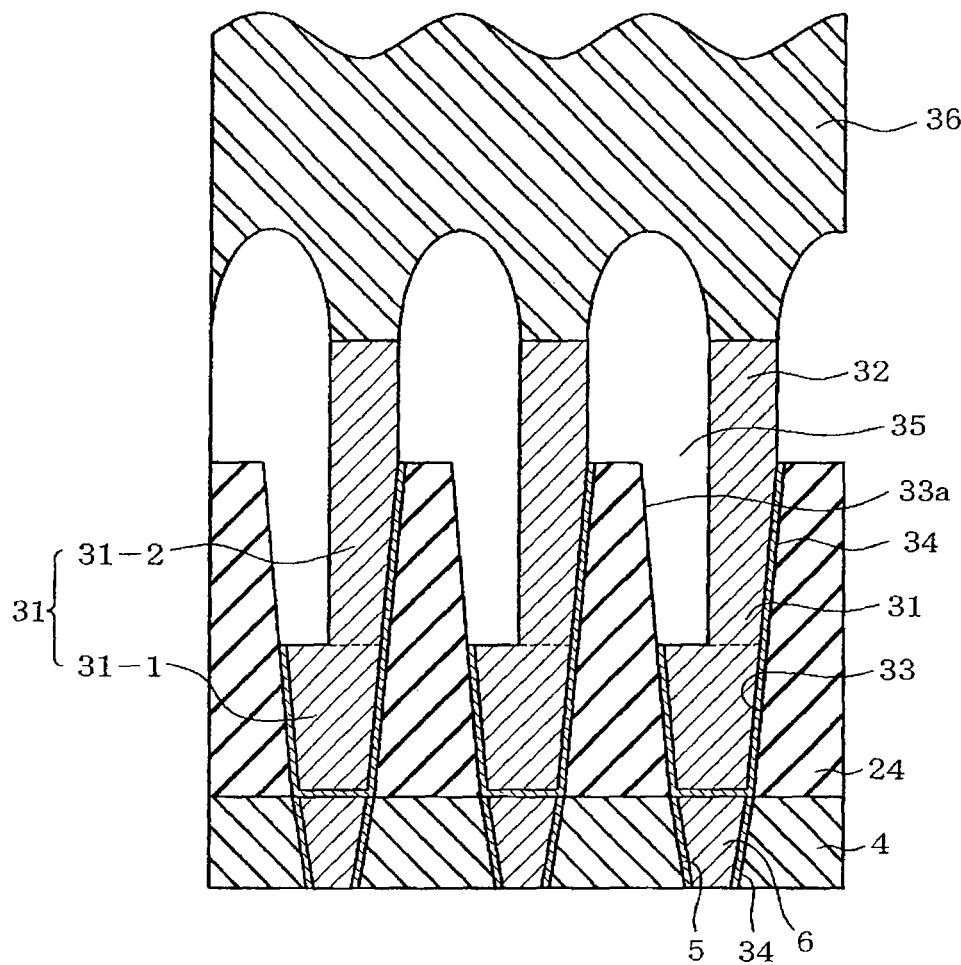
FIG. 34 corresponds to FIG. 29B in one phase of the manufacturing process flow.

Next, as shown in FIG. 34, insulating film 36, formed for example of a silicon oxide film under conditions providing poor coverage by P-CVD, is formed above the upper surfaces of wiring layer 32 and silicon oxide film 24. As a result, air gaps 35 are formed so as to expose the sidewalls on both sides of wiring layer 32 and one side surface 31a of upper contact plug 31. Air gap 35 is disposed between upper portion 31-2 of upper contact plug 31 and wiring layer 32 adjacent in the Y direction, and air gap 35 is disposed between wiring layers 32 adjacent in the Y direction. Air gap 35 further exposes inner surface 33a of silicon oxide film 24. Then, insulating film 36 is planarized for example by CMP as shown in FIG. 29B.

In the above described third embodiment, when forming upper contact plug 31 and wiring layer 32, upper portion 31-2 of upper contact plug 31 is formed in a self aligned manner with respect to wiring layer 32. As a result, it is possible to reduce the effect of misalignment of upper contact plug 31 and wiring layer 32. Thus, it is possible to suppress the leakage current occurring between upper contact plug 31 and the adjacent wiring layer 32. Further, the third embodiment is configured to establish W/2<r<W<2r when W represents the line width of wiring layer 32 and 2r represents the diametric dimension of the upper opening. As a result, it is possible to form upper portion 31-2 of upper contact plug 31 in a self aligned manner with respect to wiring layer 32 mentioned above. Further, because upper contact hole 33 is configured to have a wide upper opening, it is possible to improve the lithographic margin and processing margin, and further improve metal filling.

Further, in the third embodiment, air gap 35 is formed between upper contact 35 and the adjacent wiring layer 32, and air gap 35 is formed between wiring layers 32. As a result, it is possible to improve the breakdown voltage between upper contact plug 31 and the adjacent wiring layer 32 and suppress the leakage current occurring between them.

Further, air gap 35 may be described as being formed in a self aligned manner with respect to upper portion 31-2 of upper contact plug 31 and wiring layer 32. As a result, it is possible to form a large air gap 35. Further, it is possible to make the upper end of air gap 35 to be higher than the upper surface of wiring layer 32, and make the lowermost surface of air gap 35 to be lower than the upper surface of silicon oxide film 24.

Figure 35:
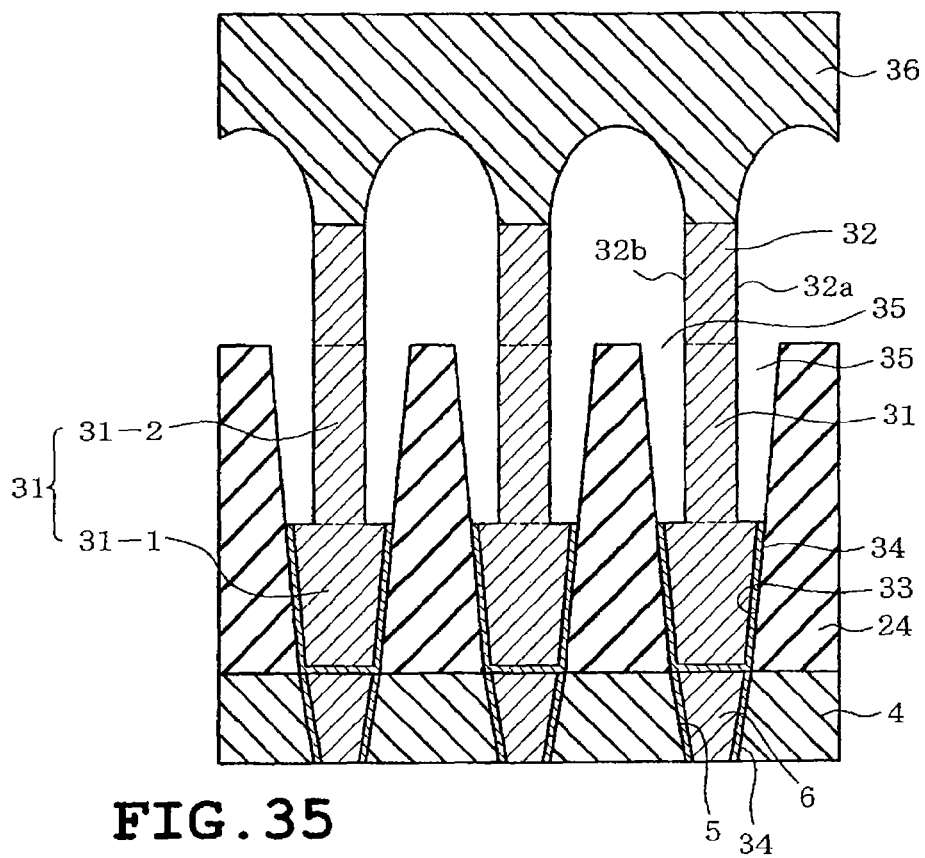
FIG. 35 corresponds to FIG. 29B and illustrates a MODIFIED EXAMPLE of the third embodiment.

FIG. 35 illustrates a MODIFIED EXAMPLE of the third embodiment. More specifically, FIG. 35 illustrates the case where the Y direction misalignment is relatively small when forming mask pattern 38 above the upper surface of conductive material 37 (see FIG. 32). The Y-direction width of upper portion 31-2 becomes substantially equal to the Y-direction width of wiring layer 32. Further, in the cross section illustrated in FIG. 35, upper contact plug 31 may be described as exhibiting a substantially reverse T shape when lower portion 31-1, upper portion 31-2, and wiring layer 32 are viewed as one. Both side surfaces of upper portion 31-1 of upper contact plug 31 are disposed by air gap 35. That is, both side surfaces of upper portion 31-1 of upper contact plug 31 are exposed and not covered by silicon oxide film 24. As a result, air gap 35 is formed entirely along both side surfaces of upper portion 31-1 of upper contact plug 31. In the above described structure, the side surfaces on both sides of upper portion 31-1 of upper contact plug 31 and the side surfaces on both sides of wiring layer 32 are coplanar. Air gap 35 is disposed between upper contact plug 31 and wiring layer 32 and between wiring layers 32 in the above described structure as was the case in the foregoing embodiments. Thus, it is possible to improve the breakdown voltage between upper contact plug 31 and the adjacent wiring layer 32 and suppress the leakage current occurring between them.

Further, it is possible to form air gap 35 in a symmetric shape and thereby inhibit capacitance variance between wiring layers 32.

(Fourth Embodiment)

Figure 36:
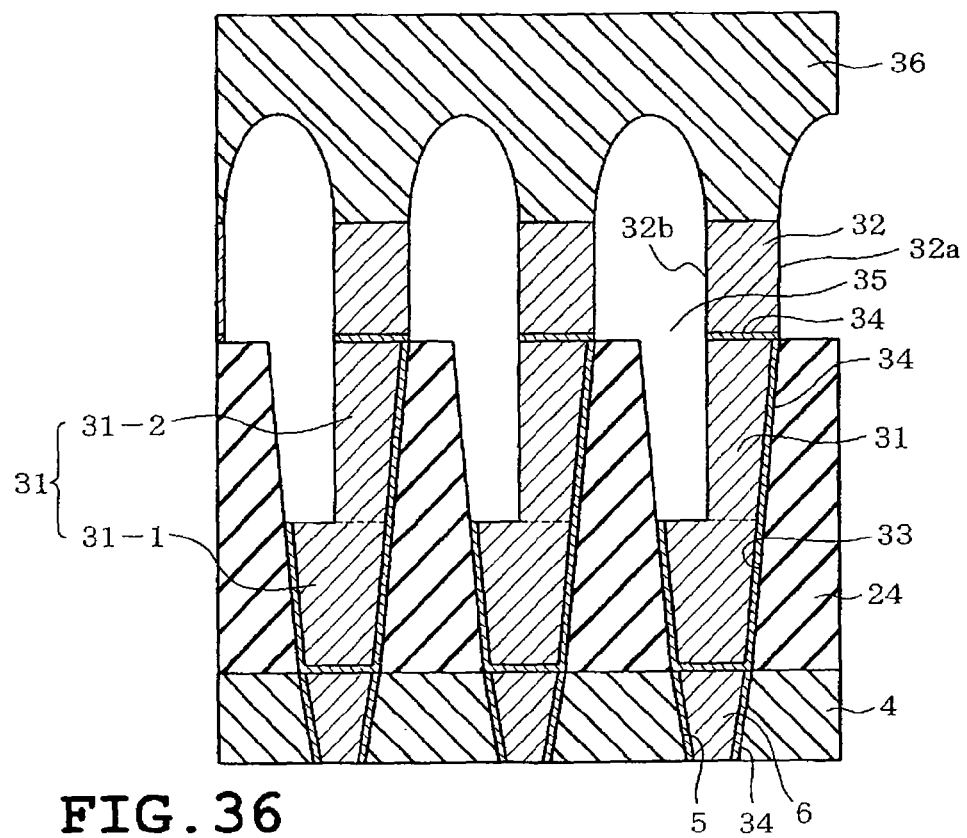
FIG. 36 corresponds to FIG. 29B and illustrates a fourth embodiment.

FIGS. 36 to 41 illustrate a fourth embodiment. Elements that are identical to those of the third embodiment are identified with identical reference symbols. In the fourth embodiment, the materials for forming upper contact plug and the wiring layer are deposited in different steps. More specifically, barrier metal 34 made of for example WN or TiN is formed between upper contact plug 31 and wiring layer 32 as shown in FIG. 36.

Figure 37:
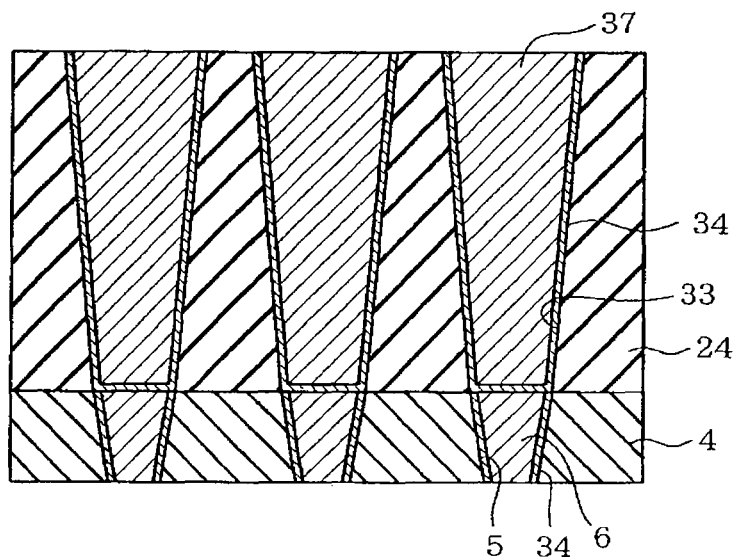
FIG. 37 corresponds to FIG. 36 in one phase of the manufacturing process flow.

Next, the manufacturing process flow of the above described structure will be described with reference to FIGS. 37 to 41. First, as shown in FIG. 30 of the third embodiment, upper contact hole 33 is formed by processing silicon oxide film 24 by known processes. Then, as shown in FIG. 37, barrier metal 34 is formed along the inner surface of upper contact hole 33 and above the upper surface of silicon oxide film 24. Then, conductive material 37 is formed above barrier metal 34 and the upper surface of conductive material 37 is planarized by CMP so that the upper surface of silicon oxide film 24 is exposed.

Figure 38:
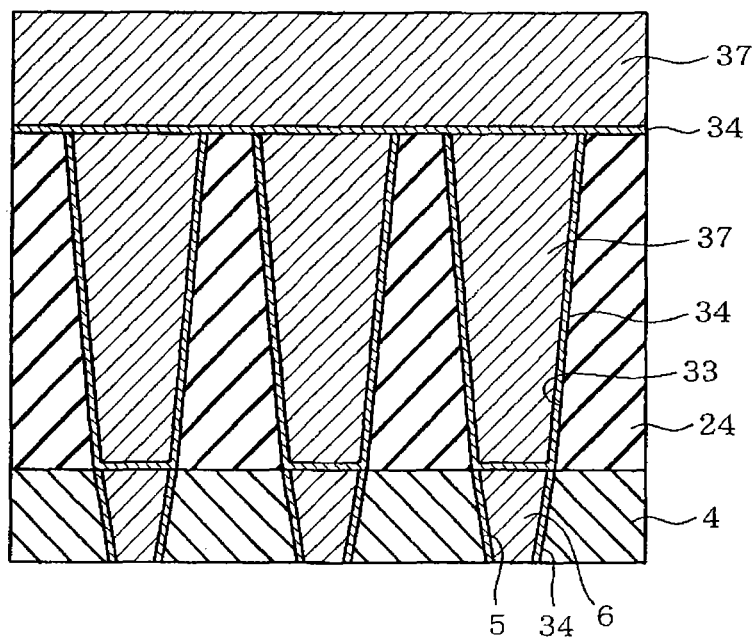
FIG. 38 corresponds to FIG. 36 in one phase of the manufacturing process flow.

Next, as shown in FIG. 38, barrier metal 34 is formed above the upper surface of silicon oxide film 24 and above the upper surface of conductive material 37. Then, conductive material 37 is formed above barrier metal 34 and the upper surface of conductive material 37 is planarized as required. Conductive material 37 is planarized so that the thickness of conductive material 37 is equal to the thickness of wiring layer 32.

Figure 39:
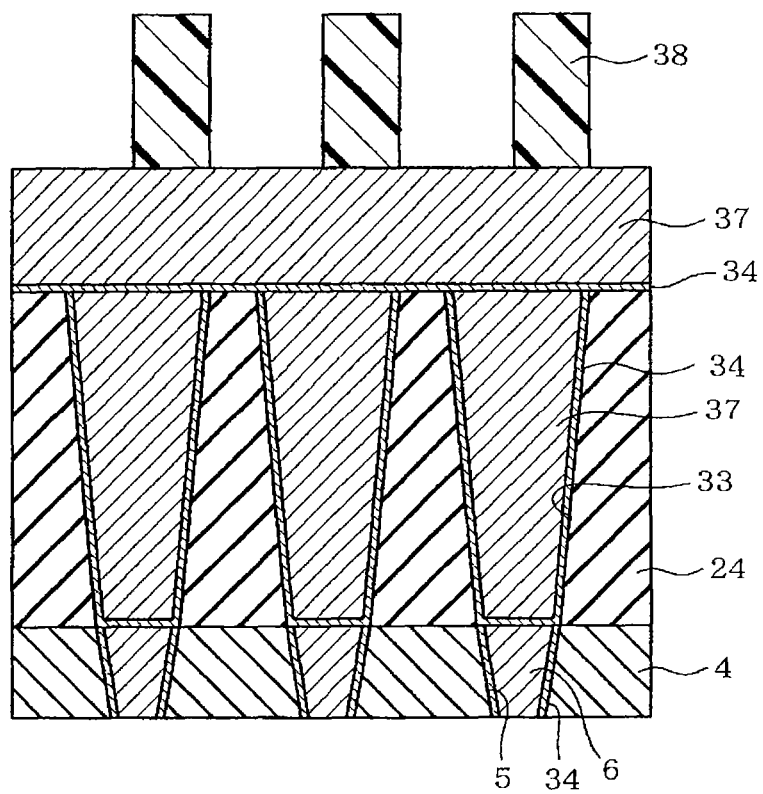
FIG. 39 corresponds to FIG. 36 in one phase of the manufacturing process flow.
Figure 40:
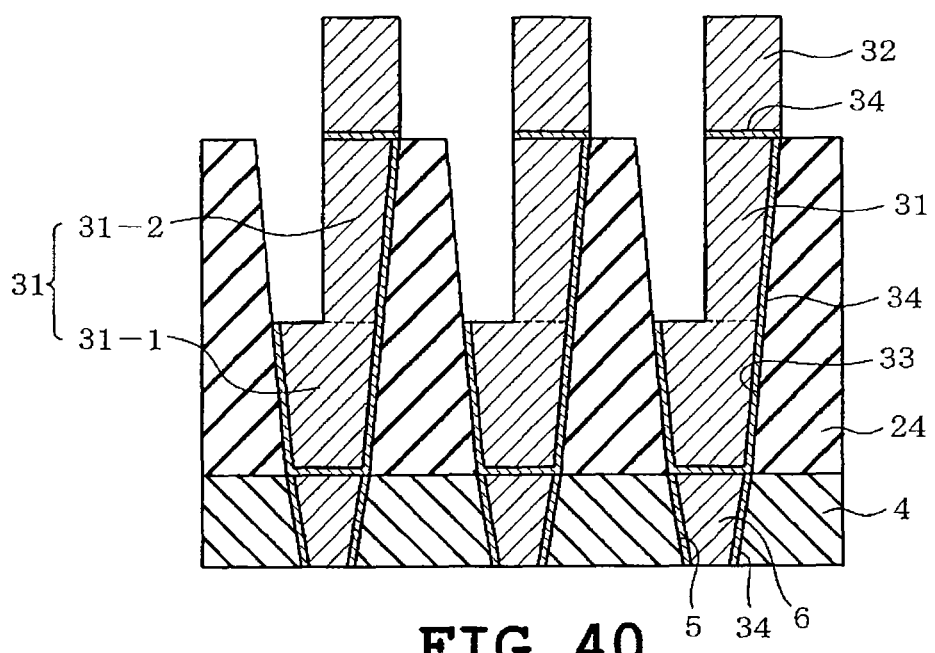
FIG. 40 corresponds to FIG. 36 in one phase of the manufacturing process flow.

Next, as shown in FIG. 39, mask pattern 38 is formed above the upper surface of conductive material 37. Mask pattern 38 is displaced rightward for example in the Y direction by misalignment. Thereafter, using mask pattern 38 as a mask, conductive material 37 (and barrier metal 34) is processed by for example RIE as shown in FIG. 40. RIE is carried out so that the etch selectivity of the conductive material 37 (and barrier metal 34) is higher than that of the silicon oxide film 24. Upper portion 31-2 of upper contact plug 31 and wiring layer 32 are formed in the above described manner.

Figure 41:
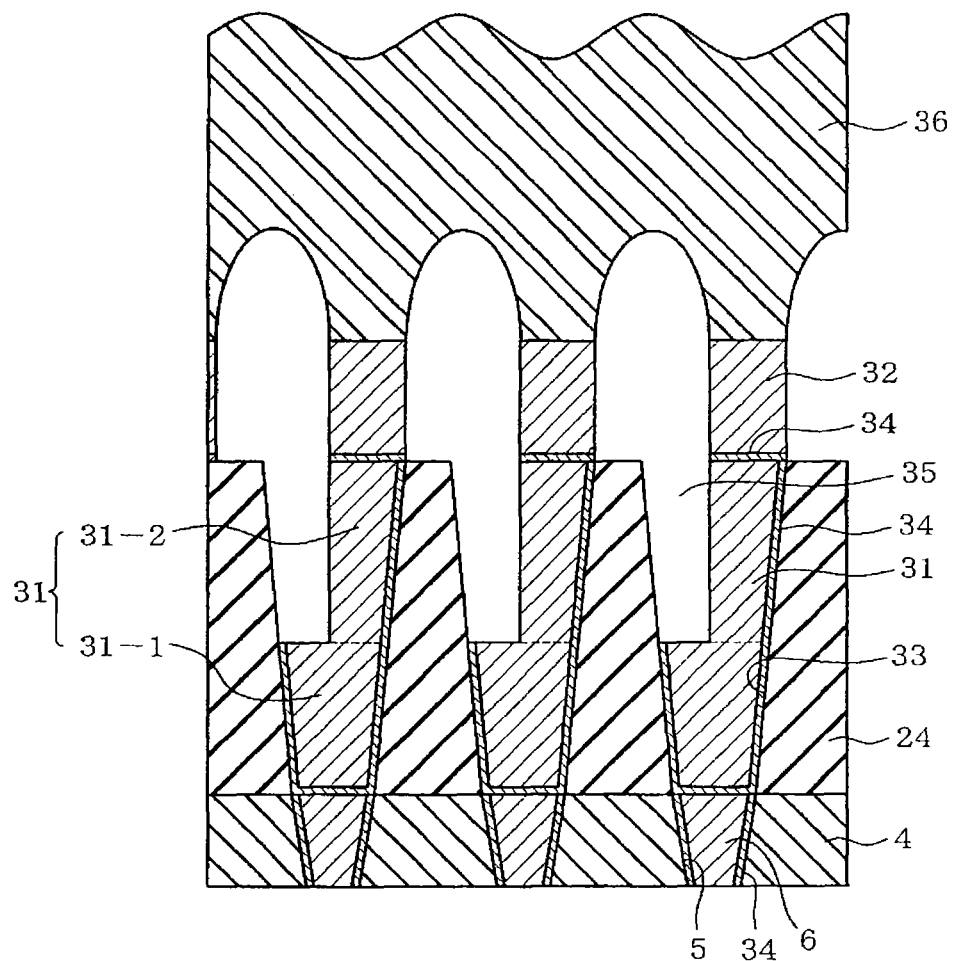
FIG. 41 corresponds to FIG. 36 in one phase of the manufacturing process flow.

Next, as shown in FIG. 41, insulating film 36, formed for example of a silicon oxide film under conditions providing poor coverage by P-CVD, is formed above the upper surfaces of wiring layer 32 and silicon oxide film 24. As a result, air gaps 35 are formed along sidewalls on both sides of wiring layer 32 and along one side wall of upper contact plug 31. Air gap 35 is disposed between upper contact plug 31 and the adjacent wiring layer 32. Then, insulating film 36 is planarized for example by CMP as shown in FIG. 36.

The structures other than those described above are identical to the structures of the third embodiment. Thus, the fourth embodiment also provides the operation and effect similar to those of the third embodiment.

(Fifth Embodiment)

FIGS. 42 to 48 illustrate a fifth embodiment. Elements that are identical to those of the third embodiment are identified with identical reference symbols. In the fifth embodiment, the size of air gap 35 is increased by removing a portion of silicon oxide film 24.

Figure 42:
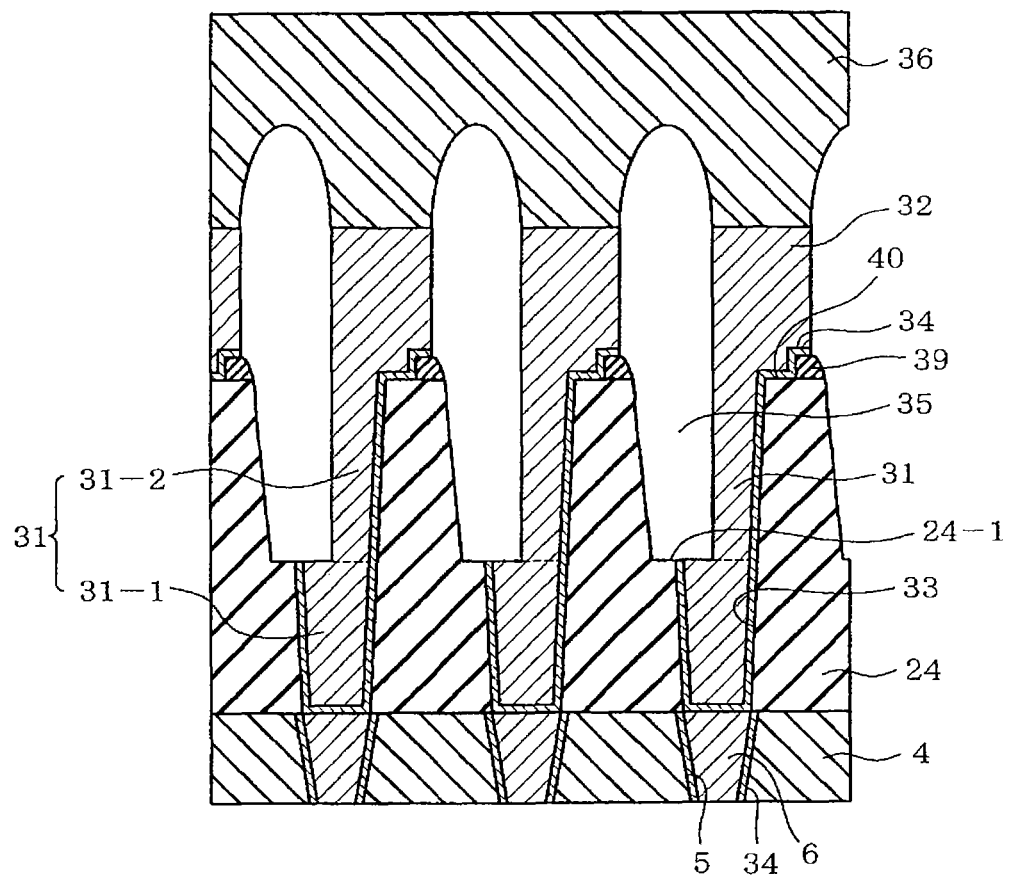
FIG. 42 corresponds to FIG. 29B and illustrates a fifth embodiment.

More specifically, a narrow projection 39 is formed above the upper surface of silicon oxide film 24 as shown in FIG. 42. Projection 39 and silicon oxide film 24 form step 40. Barrier metal 34 is formed so as to cover step 40, that is, so as to extend continuously along the upper surface of silicon oxide film 24, the side surface of projection 39, and the upper surface of projection 39. Further, conductive material 37 is formed above barrier metal 34 to form upper contact plug 31 and wiring layer 32.

Further, step 24-1 is formed on silicon oxide film 24. The height of step 24-1 is substantially equal to the height of the upper surface of lower portion 31-1. That is, the upper portion of silicon oxide film 24, located higher than lower portion 31-1, is narrowed. It may be described that silicon oxide film 24 includes an upper portion and a lower portion and a step is formed between the upper portion and the lower portion. As a result, it is possible to increase the size of air gap 35.

Air gap 35 exposes the side surfaces of silicon oxide film 24 and projection 39. The side surface of silicon oxide film 24 and the side surface of projection 39 exposed by air gap 35 are coplanar.

Figure 43:
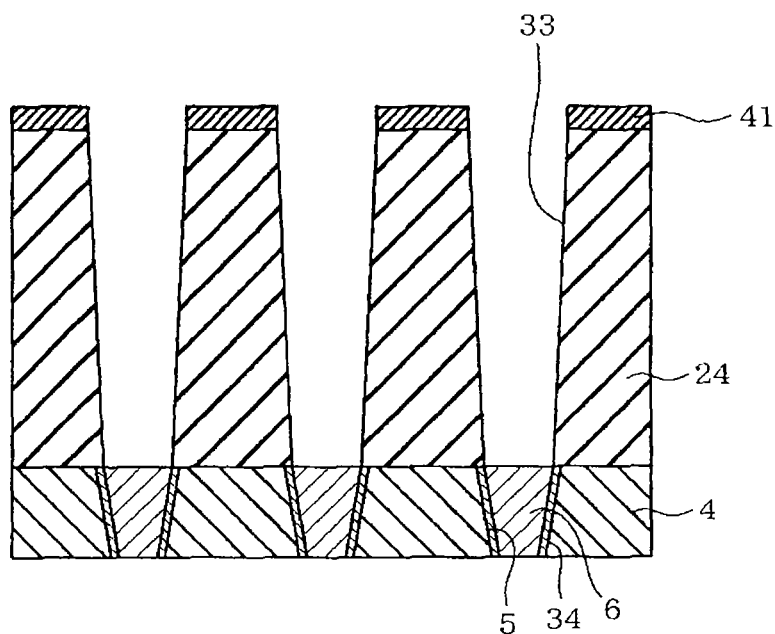
FIG. 43 corresponds to FIG. 42 in one phase of the manufacturing process flow.

Next, the manufacturing process flow of the above described structure will be described with reference to FIGS. 43 to 48. First, as shown in FIG. 43, silicon oxide film 24 and cap film (SiN film 41) are stacked above silicon oxide film 4 and lower contact plug 6 (see FIG. 5 of the first embodiment) and upper contact hole 33 is formed by processing silicon oxide film 24 and SiN film 41 by using known processes.

Figure 44:
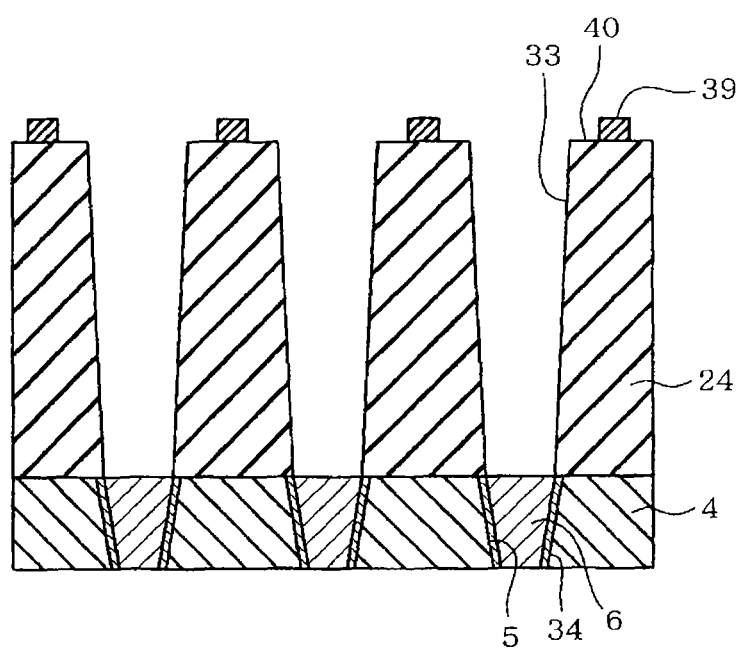
FIG. 44 corresponds to FIG. 42 in one phase of the manufacturing process flow.
Figure 45:
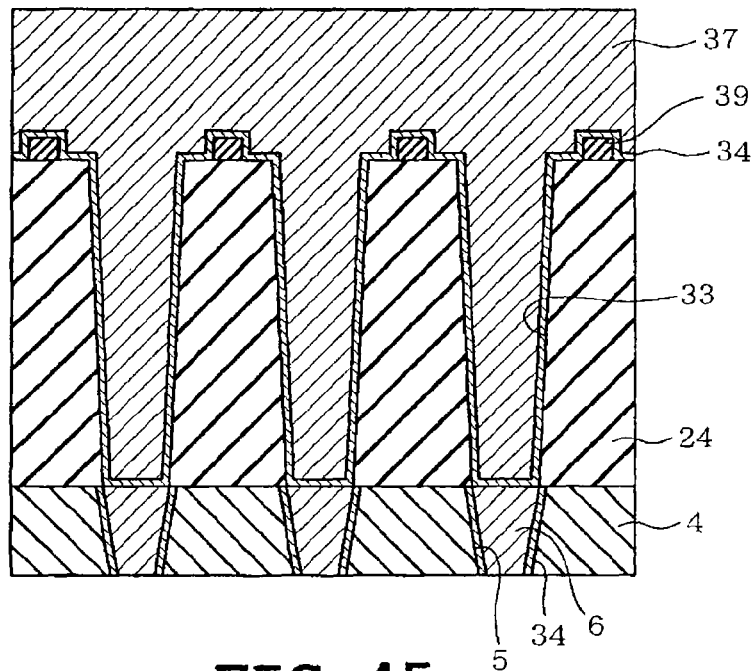
FIG. 45 corresponds to FIG. 42 in one phase of the manufacturing process flow.

Next, as shown in FIG. 44, SiN film 41 above silicon oxide film 24 is slimmed to form projection 39, that is, step 40. Then, as shown in FIG. 45, barrier metal 34 is formed along the inner surface of upper contact hole 33, above the upper surface of silicon oxide film 24, and along the side surface and the upper surface of projection 39. Thereafter, the upper surface of conductive material 37 is planarized by CMP so that the thickness of conductive material 37 above the upper surface of silicon oxide film 24 is equal to the thickness of wiring layer 32.

Figure 46:
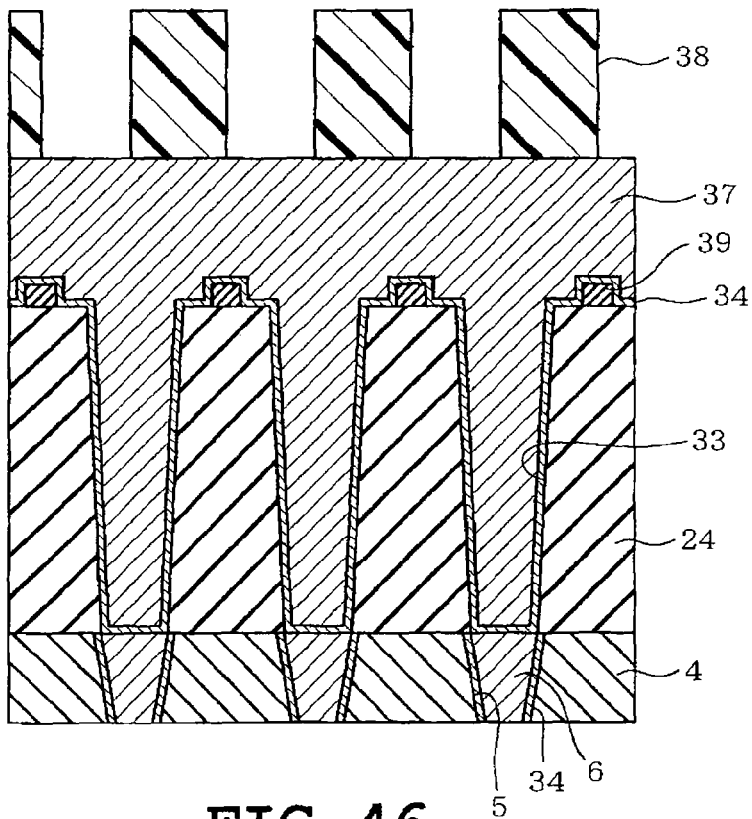
FIG. 46 corresponds to FIG. 42 in one phase of the manufacturing process flow.
Figure 47:
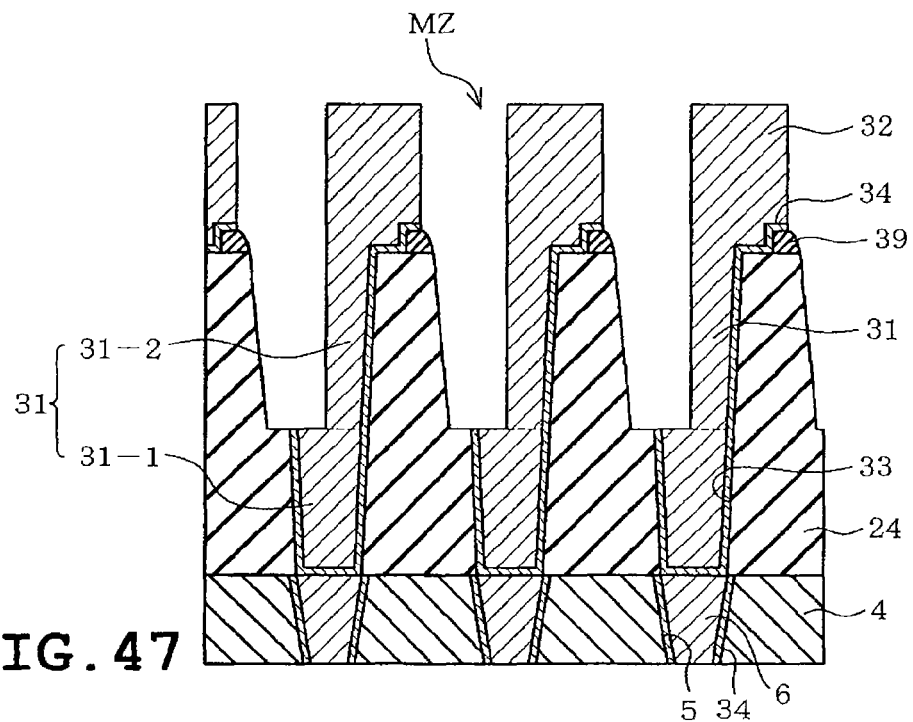
FIG. 47 corresponds to FIG. 42 in one phase of the manufacturing process flow.

Next, as shown in FIG. 46, mask pattern 38 is formed above the upper surface of conductive material 37. In the fifth embodiment, mask pattern 38 is displaced rightward for example in the Y direction by misalignment. Thereafter, using mask pattern 38 as a mask, conductive material 37 (and barrier metal 34) is processed by for example RIE as shown in FIG. 47. RIE is carried out so that silicon oxide film 24 and conductive material 37 (and barrier metal 34) have higher etch selectivity to SiN film 41 (projection 39). Upper contact plug 31 and wiring layer 32 are formed in the above described manner. It may be described that trench MZ is formed using projection 39 as a mask. In other words, the side surface of air gap 35 is formed in a self aligned manner with respect to projection 39.

Figure 48:
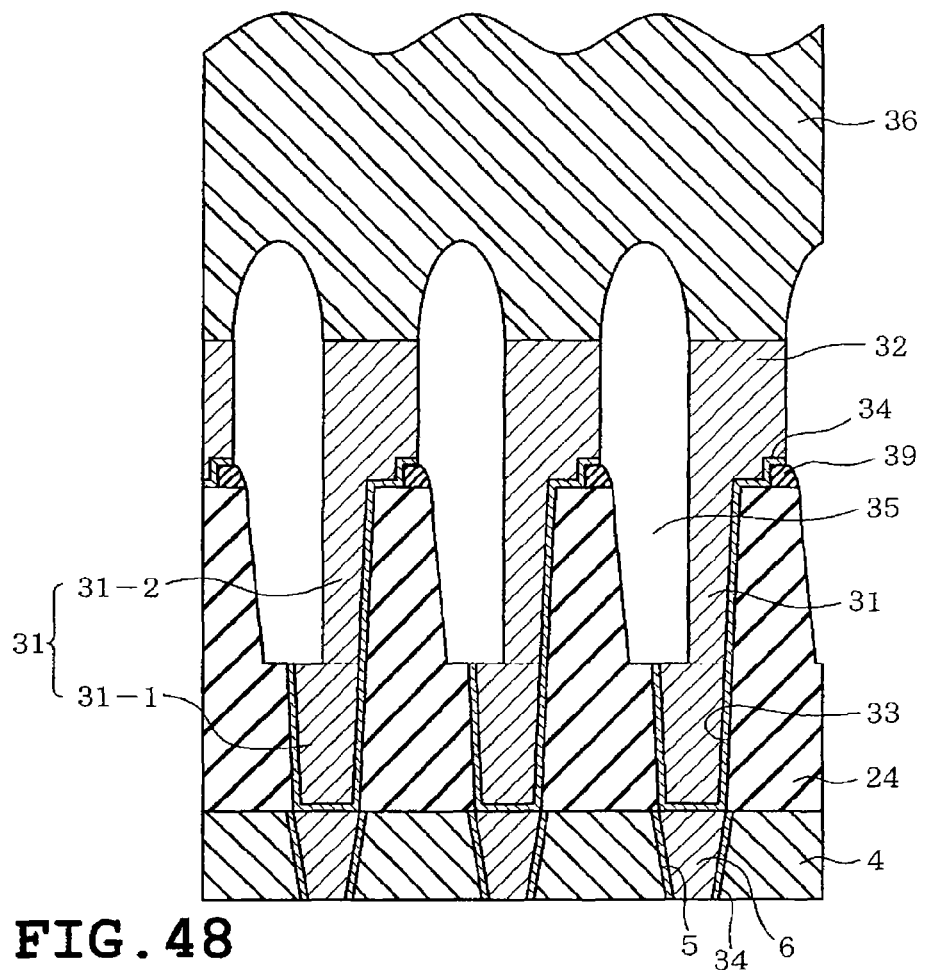
FIG. 48 corresponds to FIG. 42 in one phase of the manufacturing process flow.

Next, as shown in FIG. 48, insulating film 36, formed for example of a silicon oxide film under conditions providing poor coverage by P-CVD, is formed above wiring layer 32 and silicon oxide film 24. As a result, air gaps 35 are formed along sidewalls on both sides of wiring layer 32 and along one side wall of upper contact plug 31. Air gap 35 is disposed between upper contact plug 31 and the adjacent wiring layer 32. Then, insulating film 36 is planarized for example by CMP as shown in FIG. 42.

The structures of the fifth embodiment other than those described above are identical to the structures of the third embodiment. Thus, the fifth embodiment also provides the operation and effect similar to those of the third embodiment. Especially in the fifth embodiment, the size of air gap 35 is increased by removing a portion of the upper portion of silicon oxide film 24. Thus, it is possible to reduce the capacitance between the wirings.

Further, air gap 35 is formed in a self aligned manner with respect to projection 39. Thus, the width of the upper portion of silicon oxide film 24 will not become smaller than a certain level even if the magnitude of Y direction misalignment is increased. As a result, it is possible to increase the mechanical strength of silicon oxide film 24.

(Sixth Embodiment)

FIGS. 49 to 55 illustrate a sixth embodiment. Elements that are identical to those of the fifth embodiment are identified with identical reference symbols. In the sixth embodiment, a step is provided at a portion where the upper contact plug and the wiring layer are connected to increase the area of connection between them. Further, the materials of the upper contact plug and the wiring layer are deposited in different steps.

Figure 49:
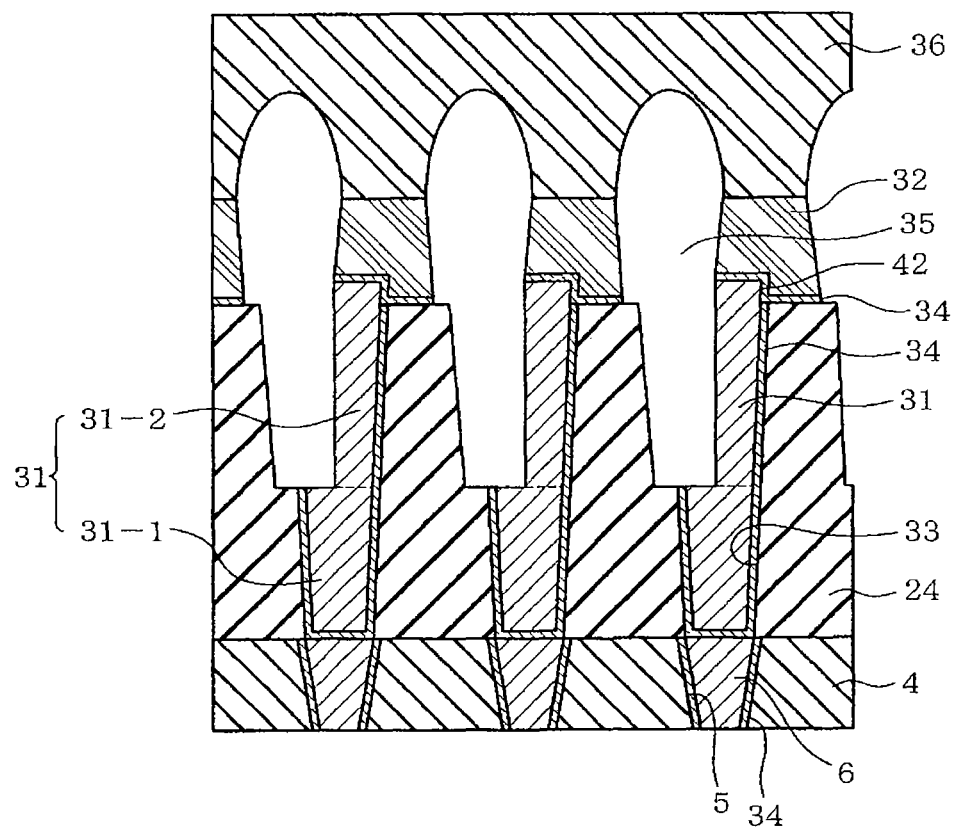
FIG. 49 corresponds to FIG. 42 and illustrates a sixth embodiment.

More specifically, step 42 is formed by projecting upper end portion 42 of upper contact plug 31 so as to be higher than the upper surface of silicon oxide film 24 as shown in FIG. 49. Then, barrier metal 34 is formed continuously along the upper surface of upper contact plug 31, the side surface of upper end portion (step) 42, and the upper surface of silicon oxide film 24. Further, conductive material 37 is formed above barrier metal 34.

Figure 50:
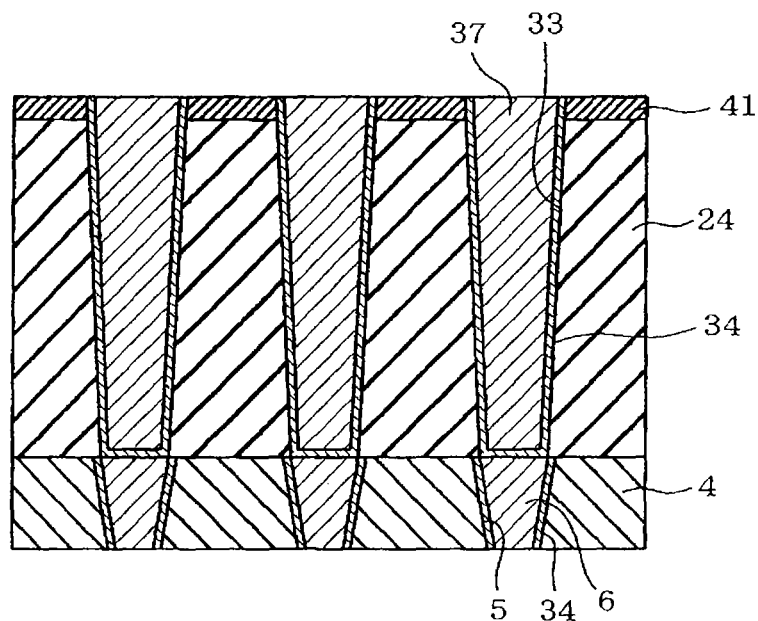
FIG. 50 corresponds to FIG. 49 and illustrates a fourth embodiment.

Next, the manufacturing process flow of the above described structure will be described with reference to FIGS. 50 to 55. First, as shown in FIG. 50, silicon oxide film 24 and cap film (SiN film 41) are stacked above silicon oxide film 4 and lower contact plug 6 (see FIG. 5 of the first embodiment) and upper contact hole 33 is formed by processing silicon oxide film 24 and SiN film 41 by using known processes. Then, barrier metal 34 is formed along the inner surface of upper contact hole 33 and above the upper surface of SiN film 41. Thereafter, conductive material 37 is formed above barrier metal 34 and conductive material 37 is planarized by CMP so that the upper surface of SiN film 41 is exposed. The structure illustrated in FIG. 50 is formed in the above described manner.

Figure 51:
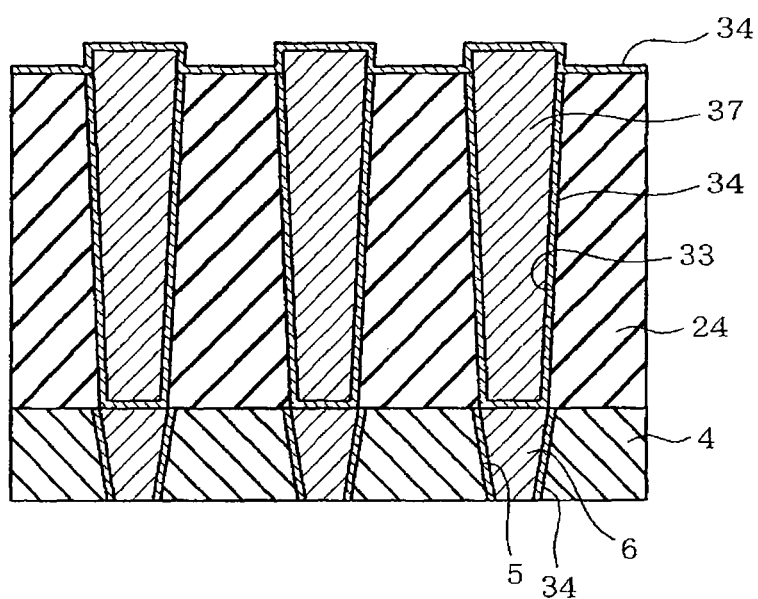
FIG. 51 corresponds to FIG. 49 in one phase of the manufacturing process flow.
Figure 52:
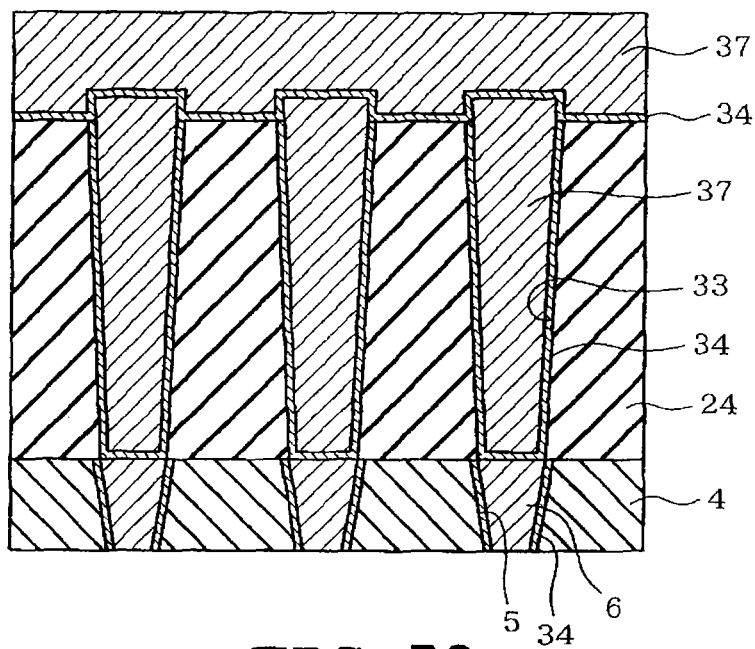
FIG. 52 corresponds to FIG. 49 in one phase of the manufacturing process flow.

Thereafter, SiN film 41 is removed and barrier metal 34 is formed along the upper surface of silicon oxide film 24 and the side surface and the upper surface of conductive material 37 as shown in FIG. 51. Then, as shown in FIG. 52, conductive material 37 is formed above barrier metal film 34 and the upper surface of conductive material 37 is planarized by CMP.

Figure 53:
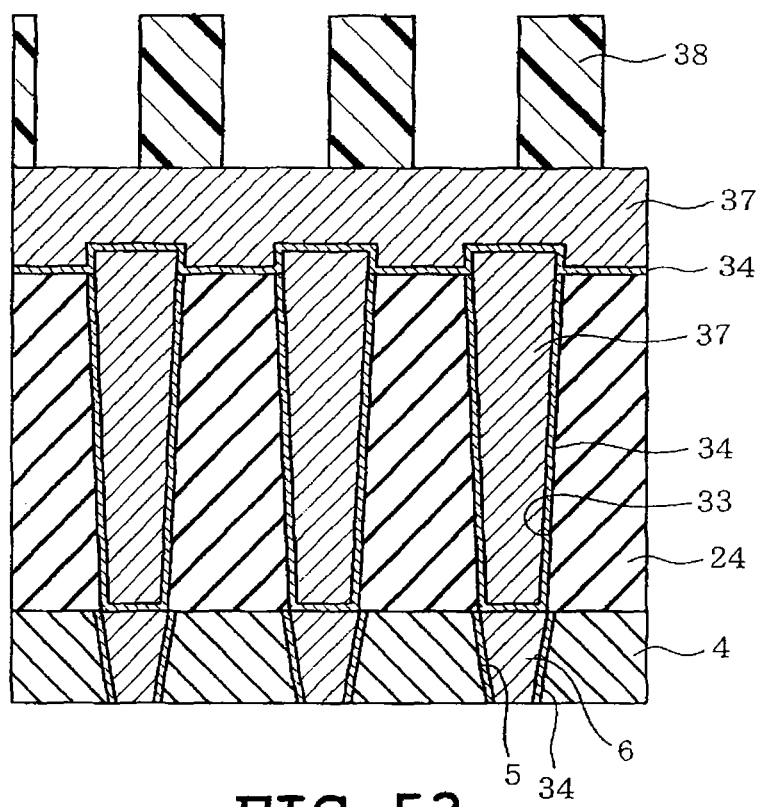
FIG. 53 corresponds to FIG. 49 in one phase of the manufacturing process flow.
Figure 54:
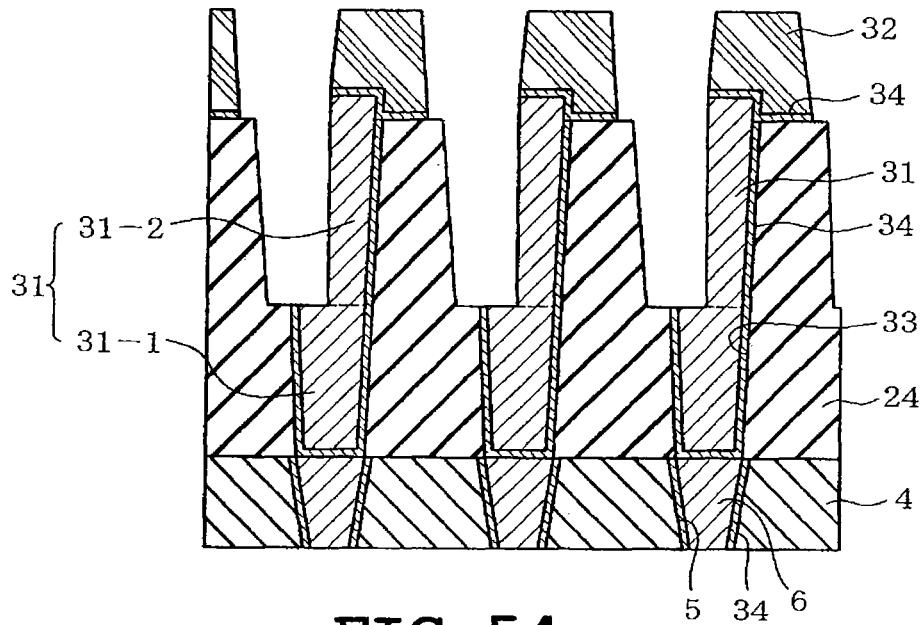
FIG. 54 corresponds to FIG. 49 in one phase of the manufacturing process flow.

Next, as shown in FIG. 53, mask pattern 38 is formed above the upper surface of conductive material 37. In the sixth embodiment, mask pattern 38 is displaced rightward for example in the Y direction by misalignment. Thereafter, using mask pattern 38 as a mask, conductive material 37 (and barrier metal 34) is processed by for example RIE as shown in FIG. 54. RIE is carried out so that conductive material 37 (and barrier metal 34) has higher etch selectivity to silicon oxide film 24. Upper contact plug 31 and wiring layer 32 are formed in the above described manner.

Figure 55:
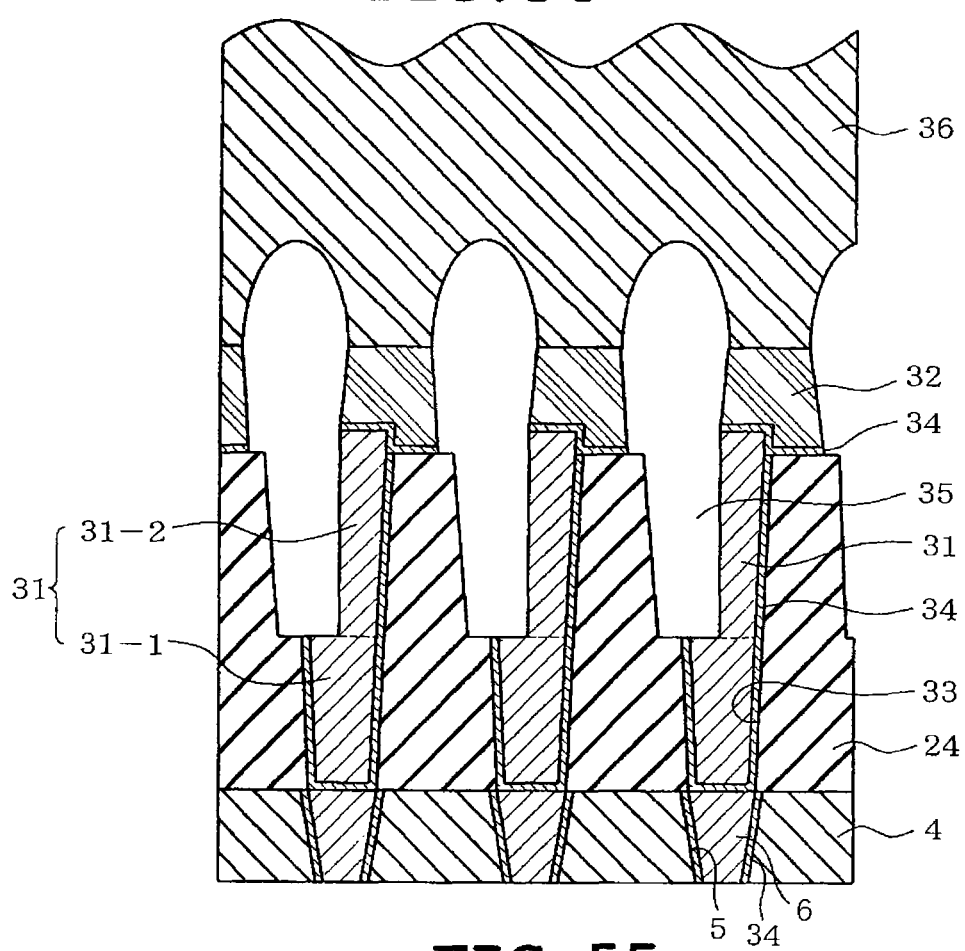
FIG. 55 corresponds to FIG. 49 in one phase of the manufacturing process flow.

Next, as shown in FIG. 55, insulating film 36, formed for example of a silicon oxide film under conditions providing poor coverage by P-CVD, is formed above wiring layer 32 and silicon oxide film 24. As a result, air gap 35 is formed along sidewalls on both sides of wiring layer 32 and along one side wall of upper contact plug 31. Air gap 35 is disposed between upper contact plug 31 and the adjacent wiring layer 32. Then, insulating film 36 is planarized for example by CMP as shown in FIG. 49.

In the sixth embodiment, step 42 is provided at a portion where upper contact plug 31 and wiring layer 32 are connected to increase the area of connection between upper contact plug 31 and wiring layer 32. As a result, it is possible to reduce connection resistance.

(Other Embodiments)

The foregoing embodiments may be modified or expanded as follows.

The embodiments described above were described through an example of a NAND flash memory device. Other embodiments may be directed to other semiconductor devices.

In the semiconductor device of the foregoing embodiments, it is possible to suppress leakage current occurring between the contact plug and the adjacent bit line.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
a semiconductor substrate;
a first contact plug having an upper end portion and a lower end portion, a diametric dimension of the upper end portion being greater than a diametric dimension of the lower end portion;
a first insulating film disposed above the semiconductor substrate and covering the first contact plug;
a second contact plug having an upper end portion and a lower end portion, a diametric dimension of the upper end portion of the second contact plug being less than a diametric dimension of the lower end portion of the second contact plug, the lower end portion of the second contact plug contacting to the upper end portion of the first contact plug;
a second insulating film disposed above the first insulating film and the first contact plug, and the second insulating film covering the second contact plug;
a wiring layer including a lower end portion contacting to the upper end portion of the second contact plug; and
a third insulating film disposed above the second insulating film and the second contact plug, and the third insulating film covering the wiring layer;
wherein the upper end portion of the first contact plug displaced from the lower end portion of the second contact plug has a step.

2. The device according to claim 1, further comprising a gap formed above the step, wherein an upper end of the gap is lower than an upper surface of the second contact plug.

3. The device according to claim 2, wherein a lower end of the gap is lower than an upper surface of the first contact plug.

4. The device according to claim 1 including two or more the first contact plugs, wherein the first contact plugs are disposed in a zigzag arrangement, and wherein the step is disposed between the first contact plugs closely disposed each other.

5. A semiconductor device, comprising:
a semiconductor substrate;
a fourth contact plug disposed above the semiconductor substrate;
a second insulating film covering at least a portion of a side surface of the fourth contact plug;
a wiring layer having a lower end portion connecting to an upper end portion of the fourth contact plug; and
a third insulating film disposed above the second insulating film and the fourth contact plug, wherein at least one plane is formed in which one of side surfaces of the fourth contact plug and one of side surfaces of the wiring layer are coplanar, wherein two or more wiring layers are disposed, and a gap is disposed between the wiring layers, and wherein the gap exposes an inner surface of the second insulating film and a portion of an inner surface of the fourth contact plug.

6. The device according to claim 5, wherein the fourth contact plug has an upper portion and a lower portion, a width of the lower portion is greater than a width of the upper portion taken in a direction orthogonal to a direction in which the wiring layer extends.

7. The device according to claim 5, wherein an upper end of the gap is higher than an upper surface of the wiring layer.

8. The device according to claim 5, wherein a lower end of the gap is lower than an upper surface of the second insulating film.

9. The device according to claim 5, further comprising a barrier metal disposed between the upper end portion of the fourth contact plug and the lower end portion of the wiring layer, wherein the barrier metal is connected to the wiring layer at an upper surface of the upper end portion of the fourth contact plug.

10. The device according to claim 5, further comprising a barrier metal disposed between the upper end portion of the fourth contact plug and the lower end portion of the wiring layer, wherein the barrier metal is connected to the wiring layer at a side surface of the upper end portion of the fourth contact plug.

11. The device according to claim 5, wherein the second insulating film has an upper portion and a lower portion and a step is disposed between the upper portion and the lower portion.

12. A semiconductor device, comprising:
a semiconductor substrate;
a fourth contact plug disposed above the semiconductor substrate;
a second insulating film covering at least a portion of a side surface of the fourth contact plug;
a wiring layer having a lower end portion connecting to an upper end portion of the fourth contact plug; and
a third insulating film disposed above the second insulating film and the fourth contact plug,
wherein at least one plane is formed in which one of side surfaces of the fourth contact plug and one of side surfaces of the wiring layer are coplanar, and
wherein $W/2 < r < W < 2r$ when:
W represents a line width of the wiring layer, and
2r represents a width of an upper opening of a fourth contact hole extending through the second insulating film and filled with the fourth contact plug.

* * * * *